(12) United States Patent
Darmawikarta et al.

(10) Patent No.: US 11,270,959 B2
(45) Date of Patent: Mar. 8, 2022

(54) ENABLING MAGNETIC FILMS IN INDUCTORS INTEGRATED INTO SEMICONDUCTOR PACKAGES

(71) Applicant: Intel Corporation, Santa Clara, CA (US)

(72) Inventors: Kirstof Darmawikarta, Chandler, AZ (US); Srinivas Pietambaram, Gilbert, AZ (US); Prithwish Chatterjee, Tempe, AZ (US); Sri Ranga Sai Boyapati, Chandler, AZ (US); Wei Lun Jen, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 836 days.

(21) Appl. No.: 15/933,599

(22) Filed: Mar. 23, 2018

(65) Prior Publication Data

US 2019/0295967 A1    Sep. 26, 2019

(51) Int. Cl.
*H01L 23/64*      (2006.01)
*H01F 27/28*      (2006.01)
(Continued)

(52) U.S. Cl.
CPC .......... *H01L 23/645* (2013.01); *H01F 1/14* (2013.01); *H01F 1/34* (2013.01); *H01F 27/2804* (2013.01); *H01F 41/041* (2013.01); *H01L 21/4857* (2013.01); *H01L 21/4867* (2013.01); *H01L 23/49822* (2013.01); *H01L 23/49838* (2013.01); *H01L 23/49866* (2013.01); *H01L 24/16* (2013.01); *H01L 2224/16227* (2013.01);
(Continued)

(58) Field of Classification Search
CPC .......... H01L 23/49822; H01L 21/4857; H01L 28/4867; H01L 2224/16227; H01L 2224/16265; H01L 2924/19042; H01L 23/645; H01F 41/041; H01F 27/2804; H01F 1/14; H01F 1/34
USPC ........................... 174/257, 260, 267
See application file for complete search history.

(56) References Cited

U.S. PATENT DOCUMENTS

| 2002/0182374 A1* | 12/2002 | Tung ...................... H05K 1/162 |
| | | 428/182 |
| 2005/0099259 A1* | 5/2005 | Harris ..................... H01L 24/13 |
| | | 336/200 |

(Continued)

*Primary Examiner* — Sherman Ng
(74) *Attorney, Agent, or Firm* — Schwabe, Williamson & Wyatt, P.C.

(57) ABSTRACT

Techniques for fabricating a semiconductor package comprising inductor features and a magnetic film are described. For one technique, fabricating a package includes: forming inductor features comprising a pad and a conductive line on a first build-up layer; forming a raised pad structure on the first build-up layer by fabricating a pillar structure on the pad, wherein a size of the pillar structure is approximately equal or equal to a corresponding size of the pad such that the pillar structure and the pad are aligned or minimally misaligned relative to each other; encapsulating the inductor features and the raised pad structure in a magnetic film; planarizing the magnetic film until top surfaces of the raised pad structure and magnetic film are co-planar; depositing an additional layer on the top surfaces; and forming a via on the raised pad structure by removing portions of the additional layer above the raised pad structure.

26 Claims, 8 Drawing Sheets

(51) Int. Cl.
  *H01F 1/14*       (2006.01)
  *H01F 1/34*       (2006.01)
  *H01L 23/498*     (2006.01)
  *H01L 21/48*      (2006.01)
  *H01L 23/00*      (2006.01)
  *H01F 41/04*      (2006.01)

(52) U.S. Cl.
  CPC ............... *H01L 2224/16265* (2013.01); *H01L 2924/19042* (2013.01); *H01L 2924/19103* (2013.01)

(56) References Cited

U.S. PATENT DOCUMENTS

| | | | |
|---|---|---|---|
| 2010/0001826 A1* | 1/2010 | Gardner | H01F 17/0006 336/232 |
| 2010/0225434 A1* | 9/2010 | Wang | H01L 24/81 336/200 |
| 2011/0169596 A1* | 7/2011 | Ahrens | H01L 23/5227 336/200 |
| 2013/0127434 A1* | 5/2013 | Ikriannikov | H01F 19/04 323/283 |
| 2014/0104288 A1* | 4/2014 | Shenoy | H01F 41/041 345/531 |
| 2015/0279920 A1* | 10/2015 | Zuo | H01L 23/49827 257/531 |
| 2017/0047155 A1* | 2/2017 | Yao | H01F 27/24 |
| 2018/0138126 A1* | 5/2018 | Chen | H01L 21/76877 |

* cited by examiner

ENABLING MAGNETIC FILMS IN INDUCTORS INTEGRATED INTO SEMICONDUCTOR PACKAGES

BACKGROUND

Field

Embodiments described herein relate to semiconductor packages. More specifically, the described embodiments are directed to inductors for semiconductor packages.

Background Information

An inductor is a passive electronic component that is typically included in a semiconductor package comprising a package substrate and one or more semiconductor dies on the package substrate. One or more inductors can be used to form a functional or fully integrated voltage regulator (IVR). The IVR can provide one or more voltage regulators for semiconductor die(s) within a semiconductor package.

Inductors used in semiconductor packages can take multiple forms. Examples include, but are not limited to, discrete inductors and air core inductors (ACIs).

Discrete inductors are generally prepackaged inductor devices (e.g., off-chip, off-package devices comprising one or more inductors, etc.). Discrete inductors typically include at least one magnetic core inductor (MCI). An MCI is an inductor comprising an insulated wire wound into a coil around a magnetic core made of a ferromagnetic or ferrimagnetic material (e.g., iron, ferrite, etc.). A magnetic core can increase the inductance of a coil by increasing the magnetic field. This increase is due to the magnetic core's higher magnetic permeability (as opposed to the relatively lower magnetic permeability of the coil itself or of a non-magnetic core such as air, glass, mica, plastic, ceramic, or any other dielectric material). Most discrete inductors are proprietary to and outsourced from third party vendors. These inductors are embedded in or surface mounted on a package substrate during semiconductor package fabrication. As used herein, a "package substrate" includes one or more of: (i) a package substrate core formed from any suitable material; and (ii) one or more layers (e.g., a metal layer, a interlayer dielectric layer, a build-up layer, a seed layer, any other layer known in the art of semiconductor manufacturing and/or packaging, etc.).

There are some drawbacks associated with discrete inductors. Discrete inductors can be costly (when compared to ACIs). Also, the embedding processes used to incorporate discrete packages into semiconductor packages can be complicated. Additionally, the surface mounting processes used to incorporate discrete packages into semiconductor packages can add an undesired thickness (e.g., z-height, etc.) to the overall thickness of the resulting semiconductor package. Discrete inductors might also require extra space outside a semiconductor package, which can be difficult to achieve in high-density microelectronic devices. Additionally, because discrete inductors are usually prepackaged devices that are proprietary to third party vendors, package design may be limited.

ACIs are typically embedded in semiconductor packages. Conventional ACI formation involves forming one or more features, portions, or constituent parts of an inductor ("inductor features") on or in one or more layers of a package substrate. For example, conductive lines may be patterned on a layer to form one or more inductor features. Examples of inductor features include, but are not limited to, a coil having any shape (e.g., a loop, a square, a circle, a spiral, etc.) formed from conductive lines and one or more pads. Generally, an ACI formed in a semiconductor package does not include a magnetic core. As a result, an ACI's magnetic permeability can be lower than an MCI's magnetic permeability. For example, the magnetic permeability of an ACI may be approximately equal or equal to the magnetic permeability of air. Examples of conductive lines are copper lines, aluminum lines, lines formed from any other metal or metal alloy as is known in the art of semiconductor packaging and/or manufacturing, etc.

ACIs have some drawbacks even though they can be less expensive than discrete inductors. One drawback is that ACIs may not generate inductance as effectively or as efficiently as discrete inductors. Another drawback is that ACIs can take up valuable real estate in a package substrate in order to generate a target inductance, which can in turn reduce the achievable input/output (I/O) density per mm per layer (IO/mm/layer) in a semiconductor package.

Several proposals for inductors that lack the drawbacks described above are in existence. One proposal is to fabricate an ACI comprising a magnetic film (e.g., a film having one or more magnetic fillers embedded therein, etc.). The magnetic film can increase the ACI's magnetic permeability, which can in turn enhance the ACI's performance. The magnetic film, however, is not easily integrated into current semiconductor fabrication processes that comply with current industry standards. One drawback associated with the magnetic film is that laser drilling of vias through the magnetic film may be difficult, costly, or complicated. For a first example, after laser drilling of a magnetic film to form vias is performed, some of the film's magnetic fillers are not ablated away, which in turn leaves residue in the resulting vias creating unwanted "dirty vias." Another drawback associated with the magnetic film is that there is a risk of contamination of bath chemistries associated with wet plating processes and/or a risk of contamination of etch tools. For one example, magnetic fillers in the magnetic film may have negative, undesirable, or unexpected interactions with bath chemistries, materials, and/or tools used in, for example, desmearing processes, electroless plating processes, flash etching processes, soft etching processes, seed etching processes, and processes involving roughening baths. For another example, introduction of the magnetic film to certain bath chemistries may result in corrosion, destruction, dissolution, or degradation of the magnetic fillers in the magnetic film. For this example, corrosion of the magnetic fillers may cause the magnetic fillers to leach into bath chemistries, which can in turn contaminate the baths and reduce the life cycle of the baths. Consequently, and for this example, a semiconductor package formed using the contaminated baths and the magnetic film may exhibit suboptimal properties (e.g., suboptimal electrical performance, etc.)

One proposal to minimize or eliminate the drawbacks described above is to tailor the magnetic film described above to current semiconductor fabrication processes that comply with current industry standards. Another proposal to minimize or eliminate the drawbacks described above is to tailor bath chemistries associated with wet processes and/or tools or materials used in etching techniques to work with the magnetic film described above. These tailoring process can be a time-consuming and expensive endeavor, which can in turn increase costs associated with semiconductor manufacturing and/or packaging. Furthermore, these tailoring processes may run a risk of over-engineering—that is, the magnetic film, the bath chemistries associated with wet processes, and/or the tools or materials used in etching techniques may be suboptimally designed due to restrictions placed on the types or amount of magnetic fillers that can be used to form the magnetic film. For example, a specific type of magnetic filler with suboptimal magnetic permeability properties (when compared to other types of magnetic fillers) may be used to form the magnetic film. For this example, the chosen magnetic filler is used despite the existence of other magnetic fillers with more optimal magnetic permeability properties in order to minimize or eliminate one or more of the drawbacks described above in connection with magnetic material(s).

BRIEF DESCRIPTION OF THE DRAWINGS

Embodiments described herein are illustrated by way of example and not limitation in the figures of the accompanying drawings, in which like references indicate similar features. Furthermore, in the figures, some conventional details have been omitted so as not to obscure from the inventive concepts described herein.

DETAILED DESCRIPTION

Figure 1A:
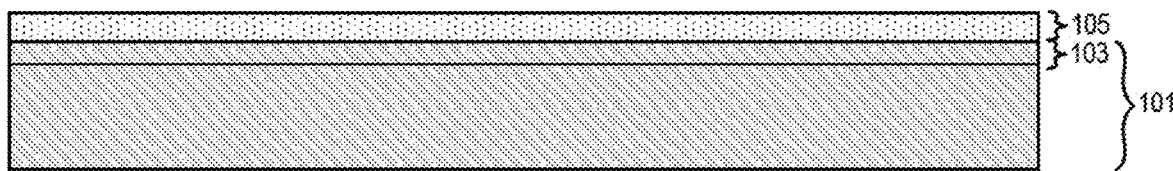
FIGS. 1A-1R are cross-sectional side view illustrations of a method of forming a semiconductor package comprising inductor features and a magnetic film according to one or more embodiments.

Embodiments described herein provide techniques that can assist with fabricating a cored or coreless semiconductor package comprising one or more inductor features and a magnetic film. For one or more embodiments, an inductor in a cored or coreless semiconductor package comprises: (i) one or more of the inductor features and; (ii) the magnetic film. Several advantages are provided by the embodiments described herein. One advantage is that the embodiment(s) described herein can assist with creating a chemically resilient technique of manufacturing an inductor comprising one or more inductor features and/or a magnetic film in a cored or coreless semiconductor package. Another advantage is that the embodiment(s) described herein can assist with providing flexibility towards the choice of materials used for fabricating a cored or coreless semiconductor package. Yet another advantage is that the inductor feature(s) and/or the magnetic film in a semiconductor package fabricated in accordance with one or more of the embodiments described herein are isolated from interacting with bath chemistries, materials, and/or tools used in desmearing processes, flash etching processes, soft etching processes, seed etching processes, electroless plating processes, seed etching processes, processes involving roughening baths, any other relevant processes, etc. One more advantage of the embodiments described herein is that no investment in specialized equipment is required to perform one or more of the techniques described herein. Another advantage is that the inductor feature(s) and/or the magnetic film can be embedded in any package substrate used to form a semiconductor package. Yet another advantage is that, for embodiments where the inductor feature(s) comprise a pillar structure and a pad, the pillar structure and pad can be designed or fabricated based on techniques used to create zero-misalignment vias and/or self-align vias in order to avoid reducing the achievable IO/mm/layer in a semiconductor package fabricated in accordance with one or more of the embodiments described herein. In this way, one or more drawbacks associated with the inductor feature(s) and/or the magnetic film as described above may be minimized or eliminated, which can in turn reduce costs associated with semiconductor manufacturing and/or packaging, with increasing the achievable IO/mm/layer in a semiconductor package, with enhancing one or more properties of a semiconductor package (e.g., enhancing a package's electrical performance, etc.), and with reducing a thickness (e.g., z-height, etc.) of a semiconductor package.

As used herein, the phrase "inductor features" and its variations refer to one or more features, portions, or constituent parts of an inductor that are formed from conductive lines patterned in or on one or more layers of a package substrate. Examples of inductor features include, but are not limited to, a coil having any shape (e.g., a loop, a square, a circle, a spiral, etc.) formed from conductive lines and one or more pads.

As used herein, the phrase "magnetic film" and its variations include, but are not limited to, a dielectric laminate film having one or more magnetic fillers embedded therein, an epoxy laminate film having one or more magnetic fillers embedded therein, an organic laminate film having one or more magnetic fillers embedded therein, an organic dielectric epoxy laminate film having one or more magnetic fillers embedded therein, a laminate film formed from any suitable material or combination of materials capable of having one or more magnetic fillers embedded therein, and any combination of two or more of the preceding films. For one embodiment, a magnetic film comprises: (i) one or more of an epoxy resin, a polyimide, and a glass-reinforced epoxy laminate material (e.g., FR4, G10, G11, FR4, FR5, FR6, etc.); and (ii) one or more magnetic fillers. Examples of a magnetic film include, but are not limited to, an organic dielectric epoxy laminate film having magnetic fillers embedded therein. Magnetic fillers may be formed from ferromagnetic and/or ferrimagnetic materials. Examples of magnetic fillers include, but are not limited to, iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, any ferrimagnetic material, and any combination thereof. As used herein, the phrase "magnetic paste composition", "magnetic paste", and their variations include, but are not limited to, a magnetically permeable paste having one or more magnetic fillers embedded therein. One non-limiting example of a magnetic paste composition is a paste comprising: (i) a suitable material (e.g., metallic material, polymeric material, any suitable organic material, any suitable inorganic material, any combination thereof, etc.); and (ii) one or more magnetic fillers. Another non-limiting example of a magnetic paste is a non-conductive epoxy or a polymer filled with one or more magnetic fillers. Yet another non-limiting example of a magnetic paste is a magnetic paste comprising: (i) any suitable magnetic paste powder known in the art of semiconductor manufacturing and/or fabrication (e.g., manganese zinc ferrite, any other suitable magnetic paste, any combination of suitable magnetic pastes, etc.); and (ii) one or more magnetic fillers.

For one or more embodiments, fabricating a cored or coreless semiconductor package comprising inductor features and a magnetic film includes, at least in part, application of a hybrid process, which may sometimes be referred to as a "hybrid litho via and laser drilling process" or an "HLL process" in the figures, detailed description, and claims set forth herein. As used herein, the term "via" refers an acronym for vertical interconnect access. For one or more embodiments, the HLL process comprises: (i) one or more lithography techniques (e.g., any known photolithography and/or lithography techniques, etc.); and (ii) one or more via-formation techniques (e.g., techniques of forming zero-misalignment vias, techniques of forming self-aligned vias, any other suitable via-formation technique, any combination of suitable via-formation techniques, etc.). For one embodiment, the HLL process comprises: forming inductor features comprising a pad and a conductive line on a first build-up layer; forming a raised pad structure on the first build-up layer by fabricating a pillar structure on the pad, wherein a size of the pillar structure is approximately equal or equal to a corresponding size of the pad such that the pillar structure and the pad are aligned or minimally misaligned relative to each other; encapsulating the inductor features and the raised pad structure in a magnetic film; planarizing a top surface of the magnetic film until top surfaces of the raised pad structure and magnetic film are co-planar; depositing an additional layer on the top surfaces; and forming a via on the raised pad structure by removing portions of the additional layer above the raised pad structure. The additional layer may comprise one or more of: (i) a build-up layer; and (ii) a photoimageable dielectric (PID) layer.

Figure 1B:
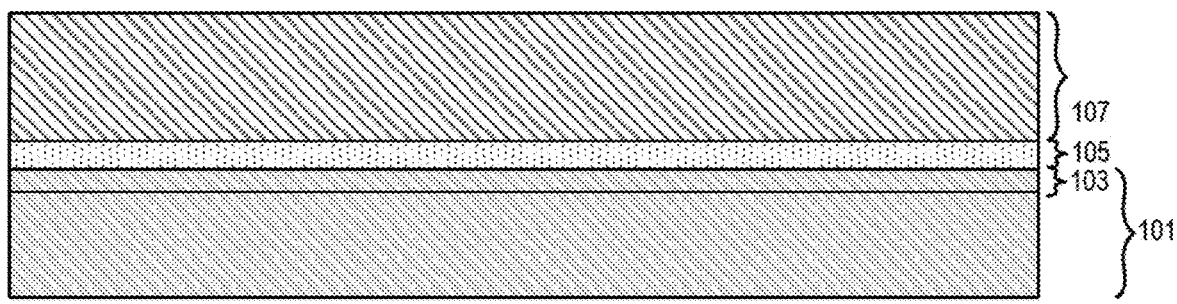
Figure 1C:
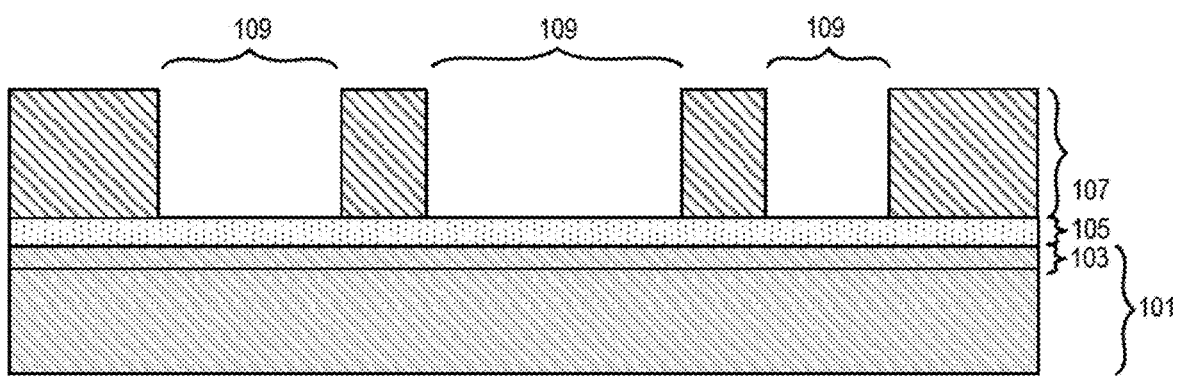
Figure 1D:
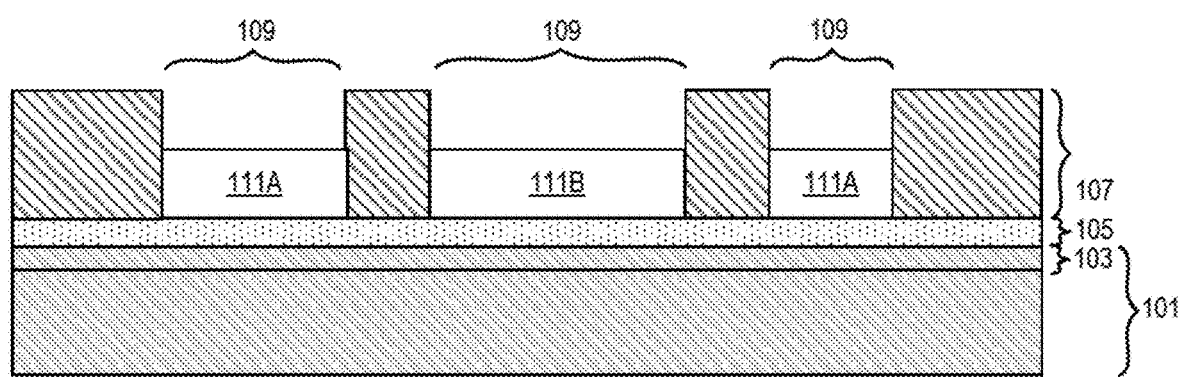
Figure 1E:
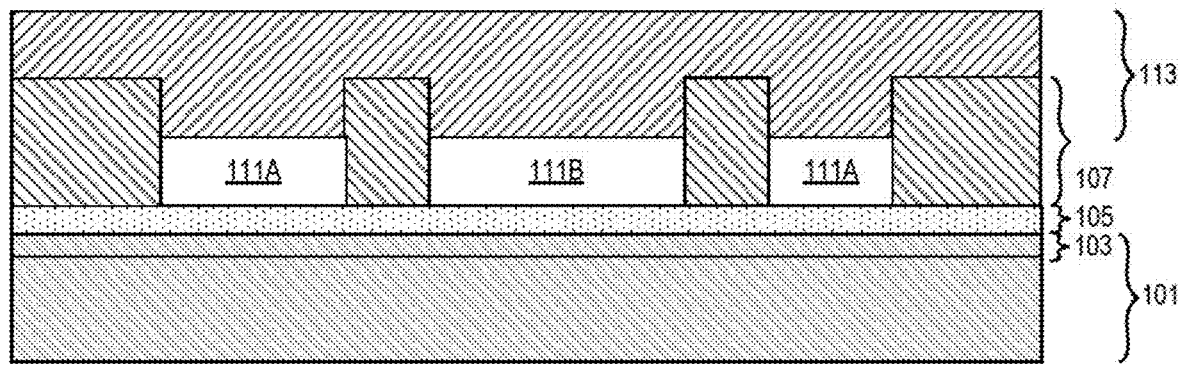
Figure 1F:
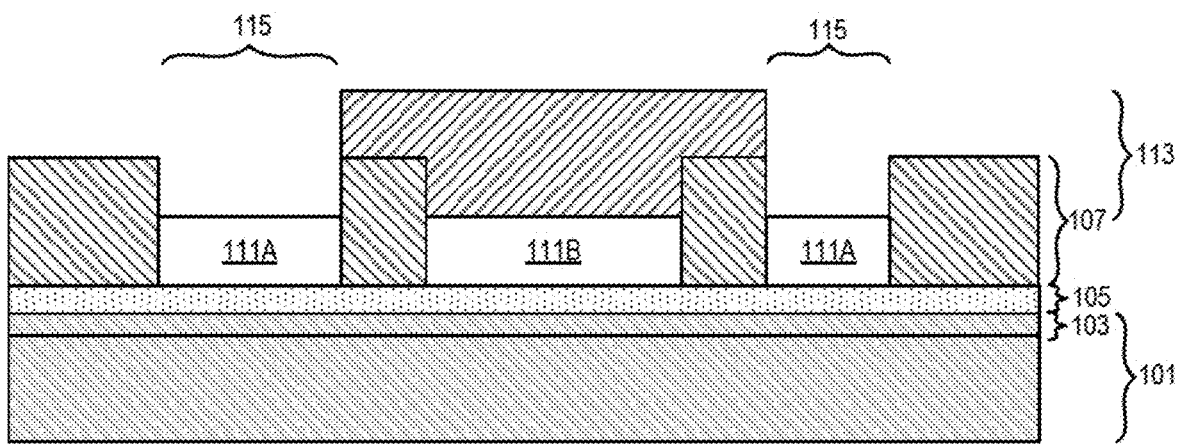
Figure 1G:
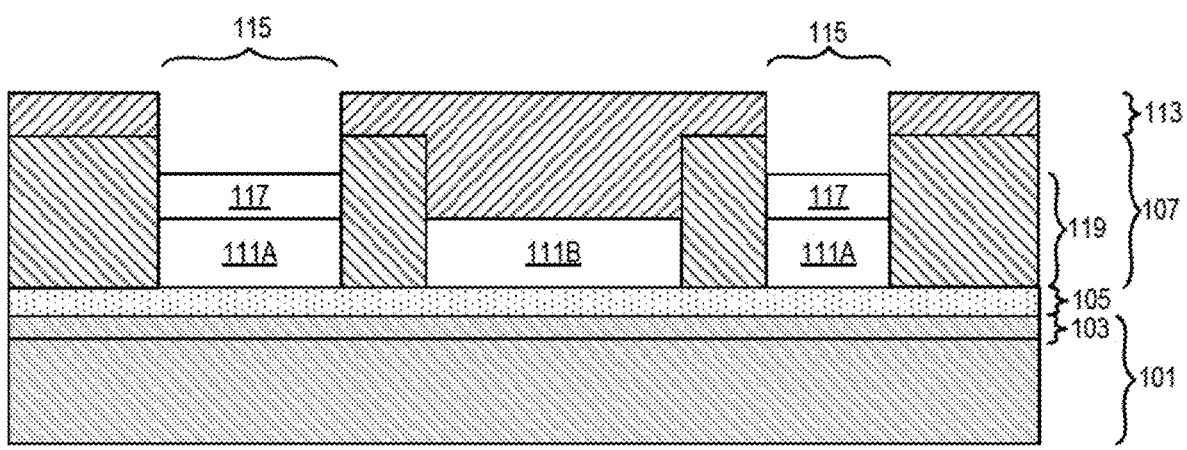
Figure 1H:
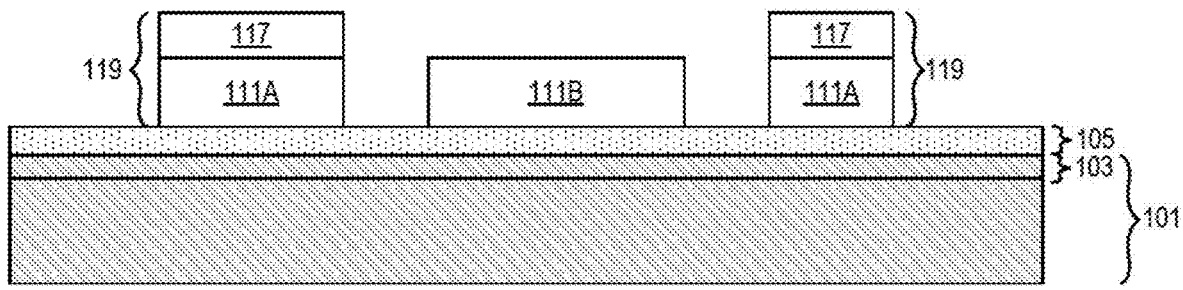
Figure 1I:
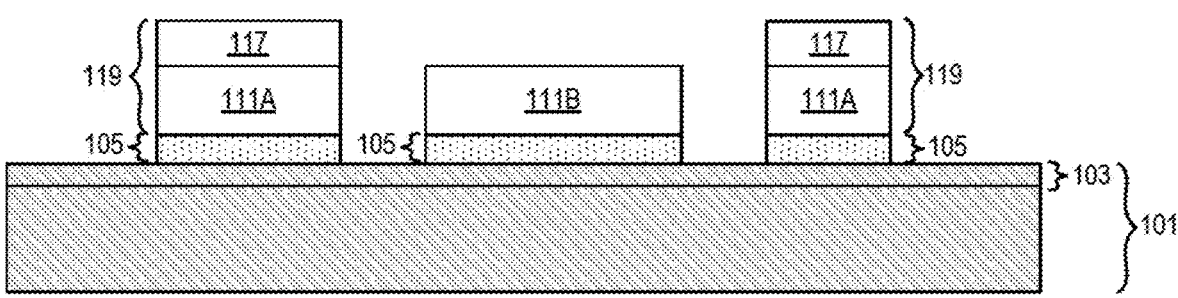
Figure 1J:
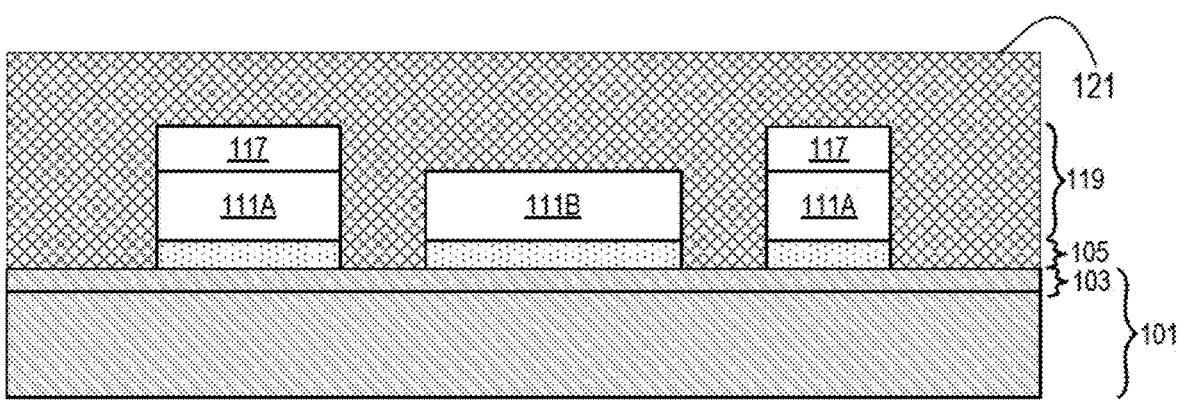
Figure 1K:
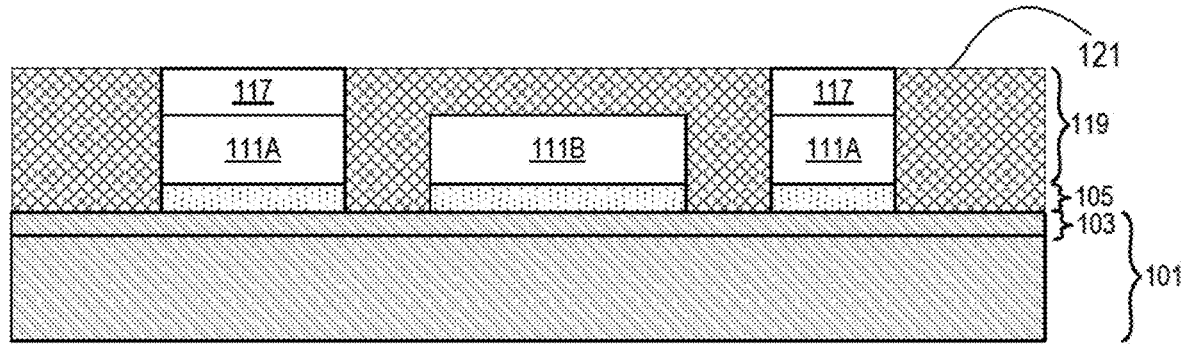
Figure 1L:
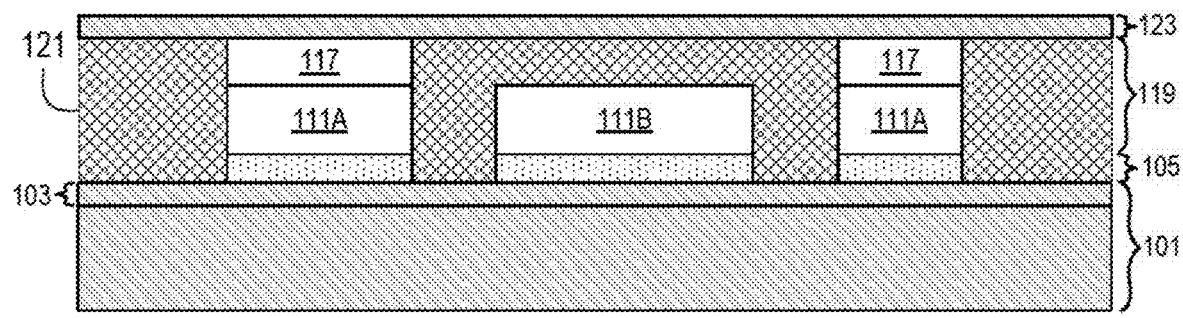
Figure 1M:
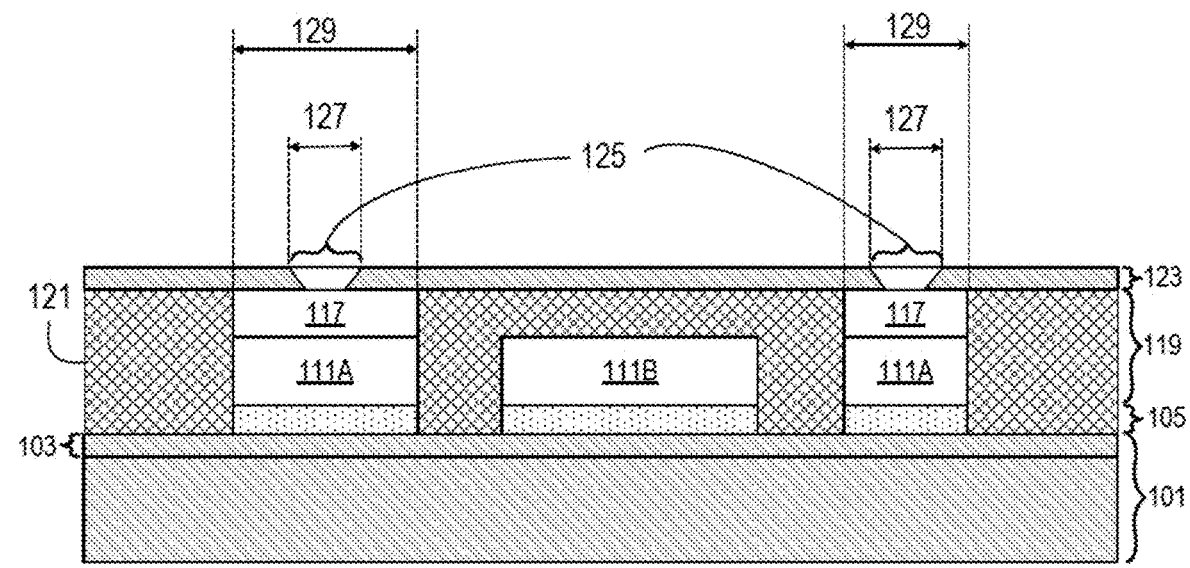
Figure 1N:
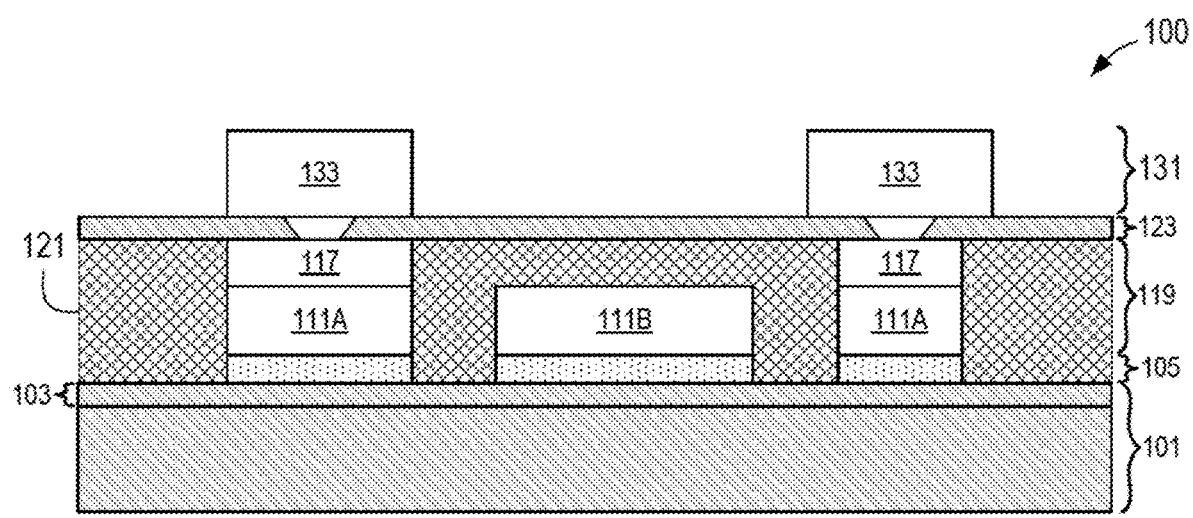
Figure 1O:
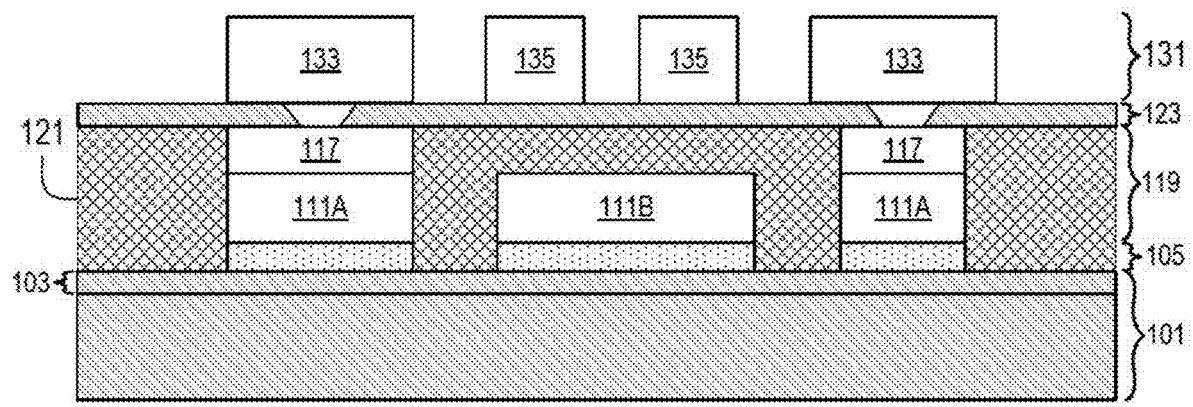
Figure 1P:
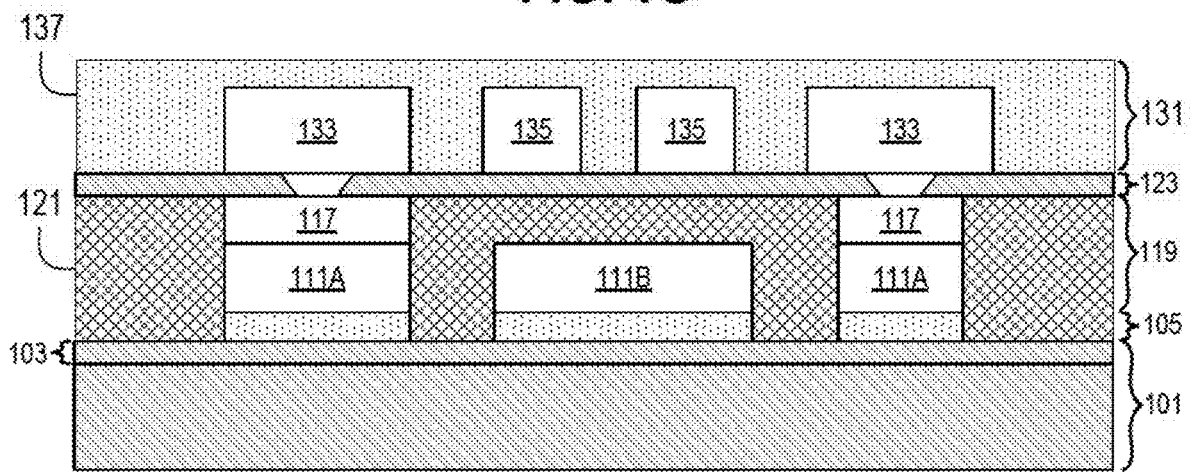
Figure 1Q:
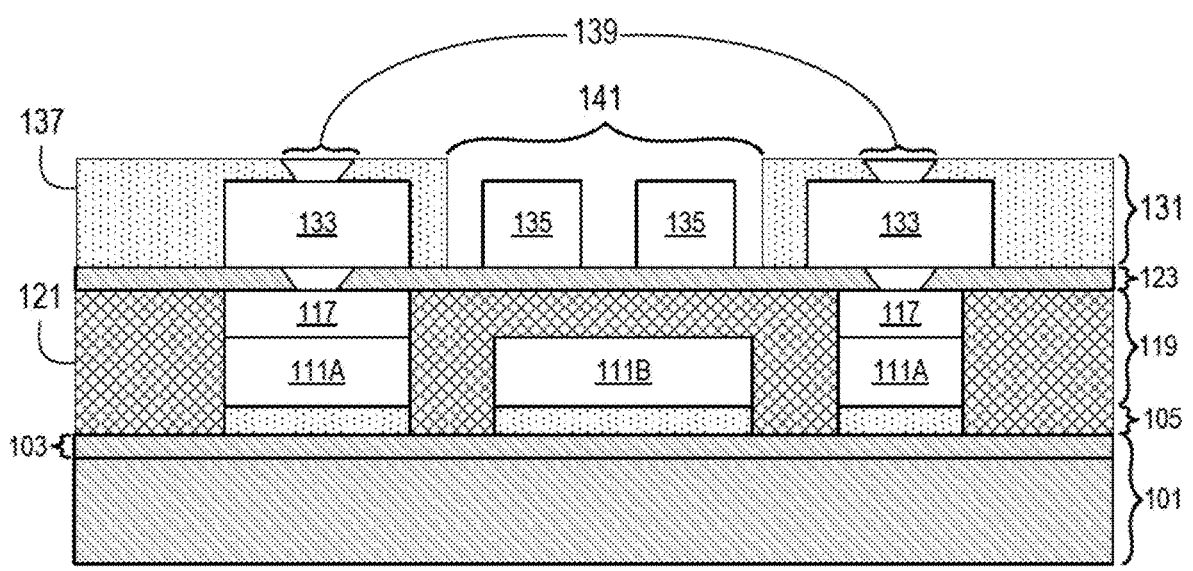
Figure 1R:
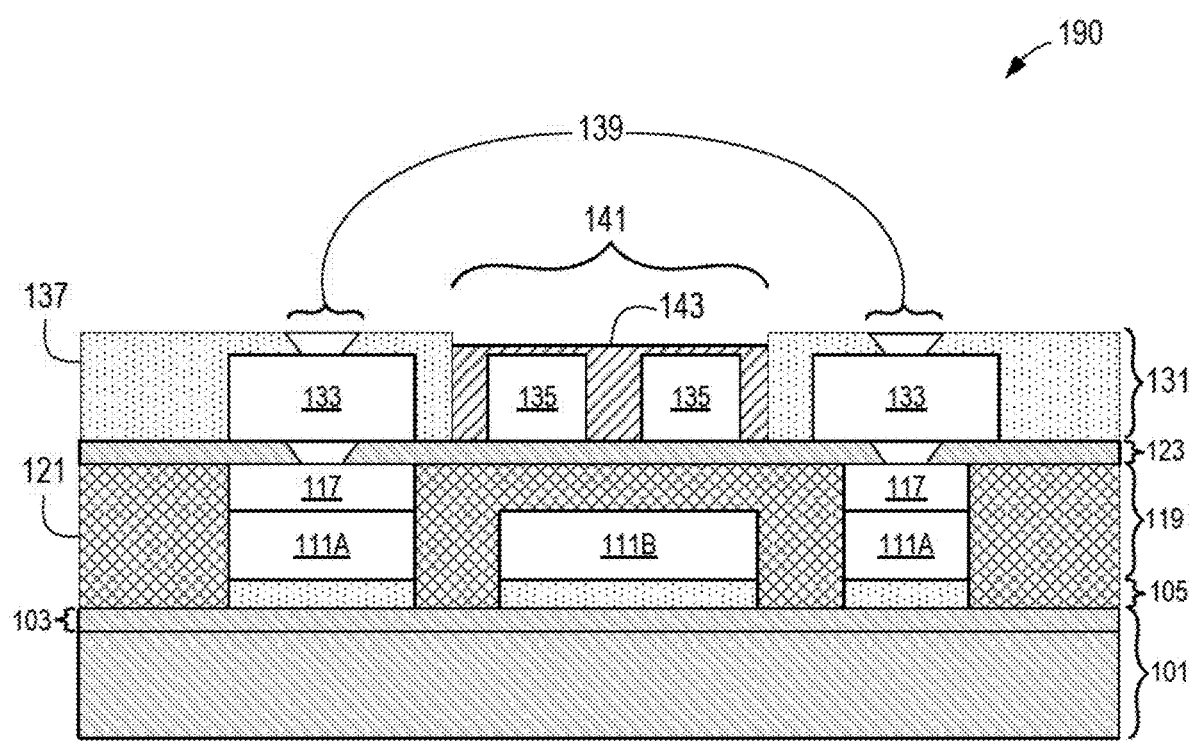

FIGS. 1A-1R are cross-sectional side view illustrations of a method of forming a semiconductor package comprising inductor features and a magnetic film according to one or more embodiments. The method shown in FIGS. 1A-1R includes an HLL process according to one embodiment. Additionally, the method shown in FIGS. 1A-1R omits one or more processes, operations, and/or steps known in the art of semiconductor manufacturing and/or packaging for simplicity and to avoid obscuring or convoluting one or more of the inventive concepts described herein. Also, for brevity, the phrase "the art", "the art of semiconductor manufacturing and/or packaging" and their variations as used herein comprise one or more of: (i) the art of semiconductor manufacturing; (ii) the art of semiconductor packaging; (iii) the field of semiconductor manufacturing; and (iv) the field of semiconductor packaging.

With regard now to FIG. 1A, a package substrate 101 is provided. The package substrate 101 resides on a cored or coreless substrate (not shown). The cored or coreless substrate on which the package substrate 101 resides may be processed using a semi-additive process (SAP). The cored or coreless substrate on which the package substrate 101 resides may be formed from any suitable materials known in the art (e.g., metal, metal alloys, silicon, epoxy resins, organic materials, inorganic materials, any combination thereof, etc.). The cored or coreless substrate on which the package substrate 101 resides may comprise a semiconductor substrate. The semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the cored or coreless substrate on which the package substrate 101 resides may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of embodiments described herein.

For one embodiment, the cored or coreless substrate on which the package substrate 101 resides comprises an organic substrate. For one embodiment, the cored or coreless substrate on which the package substrate 101 resides comprises an epoxy dielectric material (e.g., an Ajinomoto Build-up Film (ABF), any other suitable epoxy dielectric material, etc.), liquid crystal polymer, benzocyclobutene (BCB), polyimide, prepreg (a weaved fiber network "pre-impregnated" into an epoxy matrix), epoxy, or any combination thereof. For one embodiment, the cored or coreless substrate on which the package substrate 101 resides comprises inorganic fillers, such as silica. For one embodiment, the package substrate 101 is a multi-chip package substrate. For one embodiment, the package substrate 101 is a System-in-Package (SiP) substrate. For another embodiment, substrate is an interposer substrate.

For one embodiment, the cored or coreless substrate on which the package substrate 101 resides includes metal layers comprising conductive lines, pads, and/or electronic devices for integrated circuits (ICs). Examples of these electronic devices include, but are not limited to, transistors, memories, capacitors, inductors, resistors, optoelectronic devices, switches, and any other active and passive electronic devices that are separated by an electrically insulating layer, for example, an interlayer dielectric, a trench insulation layer, or any other insulating layer known in the art of the semiconductor manufacturing and/or packaging. For one or more embodiments, the cored or coreless substrate on which the package substrate 101 resides includes interconnects, for example, vias, configured to connect the metal layers.

The cored or coreless substrate may be manufactured using semi-additive processing (SAP) technology. The SAP process flow can include pre-treating the cored or coreless substrate on which the package substrate 101 is pre-treated. This pre-treatment can include one or more of: (i) a surface roughening process; and (ii) formation of one or more metal layers on the cored or coreless substrate. Surface roughening is known in the art of the semiconductor manufacturing and/or packaging and may include a process of abrading a top surface of cored or coreless substrate (mechanically, chemically, or both) to improve the adhesion of the cored or coreless substrate with subsequently formed layers and structures (e.g., metal layer(s), the package substrate 101, etc.). Surface roughening may be performed on a dielectric layer (e.g., a layer or portion thereof formed using an epoxy dielectric material, etc.). Pre-treatment of the cored or coreless substrate may also include forming one or more metal layers after surface roughening is performed. For example, the SAP process flow may include depositing a seed layer on a dielectric layer, depositing a resist layer on the seed layer, using a lithography process to create a patterned resist layer, selectively depositing metal in the patterned resist layer to form a metal layer, and subsequently removing any remaining portions of the resist, seed, and dielectric layers such that only the metal layer remains on the cored or coreless layer. For an embodiment, the metal layer(s) may be formed by a conventional electroplating process. The metal layer(s) may include copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum (Pt), or any combination thereof. For one embodiment, conductive layers include a metal alloy or a compound that includes copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), molybdenum (Mo), palladium (Pd), gold (Au), silver (Ag), or platinum (Pt), or any combination thereof. For other embodiments, the metal layer(s) may comprise any suitable material or combination of materials known in the art.

With regard again to FIG. 1A, for some embodiments, the package substrate 101 may be similar to or the same as the cored or coreless substrate described above. For one embodiment, the package substrate 101 comprises one or more layers. For example, the package substrate 101 may comprise one or more of: (i) at least one build-up layer (e.g., a dielectric layer, a build-up film, etc.), (ii) at least one metal layer; and (iii) one or more other layers known in the art (e.g., resist layer, seed layer, interlayer dielectric layer, barrier layer, passivation layer, protection layer, etc.).

The package substrate 101 may be manufactured using semi-additive processing (SAP) technology. For one embodiment, the SAP process flow used for the package substrate 101 includes depositing a build-up layer 103. The build-up layer may comprise any suitable material such as, for example, a polymer. One example of a suitable material for the build-up layer 103 is an epoxy dielectric material (e.g., an ABF, any other suitable epoxy dielectric material, etc.). The build-up layer 103 can be deposited using one or more suitable dielectric deposition techniques known to one of ordinary skill in the art. For example, the build-up layer 103 can be deposited via one or more lamination techniques known in the art. For one embodiment, the SAP process flow used for the package substrate 101 includes processing the build-up layer 103 using one or more surface roughening techniques known in the art. For one embodiment, the build-up layer 103 is laminated on the cored or coreless substrate (not shown) such that one or more metal layers of the cored or coreless substrate are electrically isolated from subsequent layers formed on the build-up layer 103.

With regard again to FIG. 1A, for one embodiment, a seed layer 105 is deposited or plated on a top surface of the build-up layer 103. The seed layer 105 can be formed from Cu, Ti, or any other suitable material or combination of materials used to form seed layers as is known in the art. The seed layer 105 can be deposited via any suitable deposition technique, e.g., an electroless plating, sputtering, chemical vapor deposition (CVD), metalorganic chemical vapor deposition (MOCVD), atomic layer deposition (ALD), any other suitable technique of depositing seed layers, a combination thereof.

With regard now to FIG. 1B, for one embodiment, a resist layer 107 is deposited on the seed layer 105. For an embodiment, the resist layer 107 is formed from resist or photoresist material(s). The resist or photoresist material(s) may comprise any suitable dielectric material known in the art (e.g., a dielectric material suitable for processing by etching techniques, etc.). The resist or photoresist material(s) may be in film form, paste form, or liquid form. The resist or photoresist material(s) may comprise positive and/or negative tone dielectric materials.

For one embodiment, the resist layer 107 is patterned using one or more lithography techniques (not shown in FIG. 1B). A lithography technique can include exposing one or more portions of the resist layer 107 to light (e.g., ultra-violet (UV), etc.) via a photomask. The lithography technique form one or more patterns in the resist layer 107. Any lithography technique known in the art can be used.

With regard now to FIG. 1C, the exposed resist layer 107 described above may be processed using a removal technique can include removing, stripping, or etching away the exposed portions of the resist layer 107 to reveal a circuit pattern comprising openings 109. The transferred circuit pattern can include, but is not limited to, a pattern for one or more inductor features 111A-B, as described below in connection with FIG. 1D. Inductor features 111A-B may include one or more of: (i) one or more pads 111A; and (ii) one or more conductive lines 111B. For one embodiment, the removal technique can be any suitable removal technique known in the art. For example, the removal technique can include chemical etching techniques, etc.

Referring now to FIG. 1D, inductor features 111A-B may be formed in the openings 109 of the patterned resist layer 107. In some embodiments, forming inductor features 111A-B may include depositing one or more metal layers in the openings 109. For one embodiment, forming inductor features 111A-B comprises performing an electrolytic metal plating operation to plate one or more metal layers (e.g., Cu, etc.) onto the top surfaces of the seed layer 105 that are not covered by the resist layer 107 so as to fill the openings 109 that remain after removal of exposed portions of the resist layer 107. As shown in FIG. 4F, each inductor feature 111A-B is separated by two pillars of the unexposed resist layer 107. Top surfaces of the inductor features 111A-B may or may not be co-planar with top surfaces of the unexposed portions of the resist layer 107. For one embodiment, the inductor features 111A-B have z-heights that are lower than z-heights of the unexposed portions of the resist layer 107. In this way, top surfaces of the inductor features 111A-B are not co-planar with top surfaces of the unexposed portions of the resist layer 107. The one or more metal layers used to form inductor features 111A-B can be deposited via any suitable deposition technique, e.g., a plating technique, any suitable technique of depositing metal layers, any combination of suitable techniques, etc. The one or more metal layers used to form inductor features 111A-B can be formed from Cu, any suitable metal (e.g., a conductive metal, etc.), any suitable metal alloy (e.g., a conductive metal, etc.), and any combination of suitable metals or metal alloys.

With regard now to FIG. 1E, a resist layer 113 can be deposited over top surfaces of the inductor features 111A-B and top surfaces of the unexposed portions of the resist layer 107. The resist layer 113 can be similar to or the same as the resist layer 107, which is described above. For one embodiment, the resist layer 113 is patterned using one or more lithography techniques (not shown in FIG. 1E). A lithography technique can include exposing one or more portions of the resist layer 113 to light (e.g., ultra-violet (UV), etc.) via a photomask. The lithography technique may be used to form patterns in the resist layer 113. Any lithography technique known in the art can be used. Referring now to FIG. 1F, the exposed resist layer 113 described above may be processed using a removal technique can include removing, stripping, or etching away the exposed portions of the resist layer 113 to reveal a pattern comprising openings 115. The pattern can include, but is not limited to, a pattern for one or more pillar structures 117, as described below in connection with FIG. 1G. For one embodiment, the removal technique can be any suitable removal technique known in the art. For example, the removal technique can include chemical etching techniques, etc.

Following removal of exposed portions of the resist layer 113, one or more surfaces of the unexposed portions of the resist layer 113 may or may not be co-planar with one or more surfaces of the unexposed portions of the resist layer 107. For a first example, one or more side surfaces of the unexposed portions of the resist layer 113 may or may not be co-planar with one or more side surfaces of the unexposed portions of the resist layer 107. For a second example, one or more top surfaces of the unexposed portions of the resist layer 113 may or may not be co-planar with one or more top surfaces of the unexposed portions of the resist layer 107.

Referring now to FIG. 1G, pillar structures 117 may be formed in the openings 115 of the patterned resist layer 113 on top surfaces of the inductor features 111A. In some embodiments, forming the pillar structures 117 may include depositing one or more metal layers in the openings 115 on top surfaces of the inductor features 111A. For one embodiment, forming the pillar structures 117 comprises performing an electrolytic metal plating operation to plate one or more metal layers (e.g., Cu, etc.) onto the top surfaces of the inductor features 111A (i.e., the pads 111A, etc.). Top surfaces of the pillar structures 117 may or may not be co-planar with top surfaces of the unexposed portions of the resist layer 107. For one embodiment, the pillar structures 117 have z-heights that are lower than z-heights of the unexposed portions of the resist layer 107. In this way, top surfaces of the pillar structures 117 are not co-planar with top surfaces of the unexposed portions of the resist layer 107. Furthermore, top surfaces of the pillar structures 117 may or may not be co-planar with top surfaces of the unexposed portions of the resist layer 113. For one embodiment, the pillar structures 117 have z-heights that are lower than z-heights of the unexposed portions of the resist layer 113. In this way, top surfaces of the pillar structures 117 are not co-planar with top surfaces of the unexposed portions of the resist layer 107.

For an embodiment, and as shown in FIG. 1G, a pillar structure 117 is fabricated on each pad 111A. For a further embodiment, a pillar structure 117 is fabricated on each pad 111A and not on any of the conductive lines 111B. Each combination of a pillar structure 117 and a pad 111A may be referred to herein as a raised pad structure 119, as shown in FIG. 1G. Consequently, and for one embodiment, each raised pad structure 119 has an increased thickness (e.g., z-height, etc.) that is larger than the thicknesses (e.g., z-heights, etc.) of the other inductor features 111B (e.g., conductive lines 111B, etc.). For one embodiment, each pillar structure 117 is formed on a pad 111A using one or more of the techniques described in one or more of: (i) U.S. Pat. No. 5,888,897 by Chunlin Liang (and/or at least one of its counterpart applications or patents); and (ii) U.S. Pat. No. 9,713,264 by Brandon M. Rawlings et al. (and/or at least one of its counterpart applications or patents). For one embodiment, there is little to no misalignment between a pillar structure 117 and the respective pad 111A on which the pillar structure 117 is fabricated. This misalignment may be measured in terms of dimensions as defined by a coordinate system. For example, misalignment may be measured in terms of dimensions as defined by the x-direction, y-direction, and/or z-direction. For one embodiment, dimensions of the pillar structure 117 and the respective pad 111A are at least approximately similar in all directions other than the direction of the other inductor features 111B (e.g., conductive lines 111B, etc.). Consequently, a raised pad structure 119 is advantageously achieved.

For one embodiment, a size (e.g., width, length, etc.) of the pad 111A is the same as approximately the same as a corresponding size (e.g., width, length, etc.) of the pillar structure 117. In this way, the pad 111A and the pillar structure 117 are aligned or minimally misaligned relative to each other. For this embodiment, one or more surfaces of the pillar structure 117 may be co-planar or substantially co-planar with one or more surfaces of the pad 111A. For example, one or more side surfaces of the pillar structure 117 are co-planar or substantially co-planar with one or more side surfaces of the pad 111A. For a further example, each side surface of the pillar structure 117 is co-planar or substantially co-planar with a corresponding side surface of the pad 111A.

For another embodiment, a size (e.g., width, length, etc.) of the pillar structure 117 is less than or equal to a corresponding size (e.g., width, length, etc.) of pad 111A. In this way, the pad 111A and the pillar structure 117 are aligned or minimally misaligned relative to each other. For this embodiment, one or more surfaces of the pillar structure 117 may be co-planar or substantially co-planar with one or more surfaces of the pad 111A. For example, one or more side surfaces of the pillar structure 117 are co-planar or substantially co-planar with one or more side surfaces of the pad 111A. For a further example, only one side surface of the pillar structure 117 is co-planar or substantially co-planar with a corresponding side surface of the pad 111A.

For yet another embodiment, a size (e.g., width, length, etc.) of the pillar structure 117 is less than a corresponding size (e.g., width, length, etc.) of pad 111A. In this way, the pillar structure 117 is formed on the pad 111A, even though the pillar structure 117 and the pad 111A may, in some scenarios, be misaligned relative to each other. For this embodiment, one or more surfaces of the pillar structure 117 may not be co-planar or substantially co-planar with one or more surfaces of the pad 111A. For example, one or more side surfaces of the pillar structure 117 are not co-planar or substantially co-planar with one or more side surfaces of the pad 111A. For a further example, each side surface of the pillar structure 117 is not co-planar or substantially co-planar with a corresponding side surface of the pad 111A.

With regard now to FIG. 1H, the patterned resist layers 107 and 113 may be removed to uncover or reveal one or more portions of the seed layer 105. For one embodiment, no inductor features 111A-B are on the uncovered portion(s) of the seed layer 105. This removal operation is performed subsequent to formation of the inductor features 111A-B and pillar structures 117. The patterned resist layers 107 and 113 may be removed or stripped by conventional techniques, such as by use of one or more resist stripping techniques known in the art, any other suitable technique used for removing resist layers known in the art, and any combination of suitable techniques used for removing resist layers known in the art. As used herein, "an uncovered portion of a layer" and its variations are used to mean that a top surface of the uncovered portion is revealed because no component or layer is on the uncovered portion. As used herein, "a covered portion of a layer" and its variations are used to mean that a top surface of the covered portion is not revealed because one or more components or layers are on the uncovered portion. Side surfaces of a covered portion of a layer may or may not be covered by any component, layer, or material.

Referring now to FIG. 1I, the uncovered portion(s) of the seed layer 105 may be removed to uncovered or reveal one or more portions of the build-up layer 103. For one embodiment, no portion of the seed layer 105 is on the uncovered portion(s) of the build-up layer 103. This removal operation is performed subsequent to removal of the patterned resist layers 107 and 113. The uncovered portion(s) of the seed layer 105 may be removed by conventional techniques, such as by use of one or more etching techniques known in the art, any other suitable technique used for removing seed layers known in the art, and any combination of suitable techniques used for removing seed layers known in the art.

Moving on to FIG. 1J, a magnetic film 121 is used to encapsulate the raised pad structures 119 (i.e., the pads 111A and the corresponding pillar structures 117 on the pads 111A), the other inductor features 111B (e.g., conductive lines 111B, etc.), covered portions of the seed layer 105, and uncovered portions of the build-up layer 103. For one embodiment, the magnetic film 121 is applied using one or more lamination techniques known in the art. Magnetic films are described above.

Referring now to FIG. 1K, one or more planarization techniques may be used to make top surfaces of the raised pad structures 119 and the magnetic film 121 co-planar (or substantially co-planar) with each other. For one embodiment, any known planarization technique may be used. Examples of planarization techniques include, but are not limited to, mechanical planarization techniques (e.g., grinding, etc.), chemical planarization techniques, and any combination thereof. For an embodiment, one or more mechanical planarization techniques may be used.

With regard now to FIG. 1L, one or more additional layers 123 may be formed on the co-planar (or substantially co-planar) top surfaces of the raised pad structures 119 and magnetic film 121. One or more of the layers 123 may be in film form, paste form, or liquid form.

For one embodiment, at least one of the layer(s) 123 is a build-up layer (e.g., a build-up film, a dielectric layer, etc.). The build-up layer may be formed from any suitable material or combination of materials (e.g., an epoxy dielectric material, any suitable dielectric material, any combination thereof, etc.). For a specific example of the build-up layer of the layer(s) 123 can be formed from any suitable dielectric material known in the art (e.g., a dielectric material suitable for processing by laser drilling and/or ablation techniques, a dielectric material suitable for processing by etching techniques, etc.).

For one embodiment, at least one of the layer(s) 123 is a photoimageable dielectric (PID) layer formed from any suitable PID material known in the art. The PID material may be in film form, paste form, or liquid form. PID materials may comprise positive and/or negative tone PID materials. In FIG. 1M, vias 125 may be formed on the raised pad structures 119 by removing portions of the layer(s) 123 above the raised pad structures 119. Removing portions of the layer(s) 123 above the raised pad structures 119 can be performed by laser drilling, laser ablation, chemical etching techniques, lithography techniques, any suitable removal technique, and any combination of suitable techniques known in the art of semiconductor fabrication. The vias 125 may be conductive vias.

For one or more embodiments, a size 127 of a via 125 is less than or equal to a corresponding size 129 of a raised pad structure 119. In this way, the vias 125 are formed exclusively on the top surfaces of the raised pad structures 119 without being formed on the magnetic film 121. For one embodiment, a size 127 (e.g., a width, a length, etc.) of a via 125 is less than or equal to a corresponding size 129 (e.g., a width, a length, etc.) of a top surface of the raised pad structures 119. For one embodiment, a size 127 of a via 125 is approximately equal or equal to a corresponding size 129 of a raised pad structure 119 such that the via 125 and the raised pad structure 119 are aligned or minimally misaligned relative to each other. For one embodiment, a size 127 of a via 125 is less than a corresponding size 129 of a raised pad structure 119 such that the via 125 is formed on the raised pad structure 119 even though the via 125 and the raised pad structured 119 may, in some scenarios, be misaligned relative to each other.

Vias 125 may be formed using any suitable technique known in the art (e.g., wet or dry etching, lift-off, laser drilling, laser ablation, lithography techniques that are followed by removal techniques, any other suitable technique, any combination of suitable techniques, etc.). Techniques used to form the vias 125 are a design choice that is dependent on the materials that comprise the layer(s) 123. For one example, where the layer(s) 123 include a build-up layer formed from a dielectric material (e.g., an epoxy dielectric material, etc.), laser drilling and/or laser ablation techniques may be used to form vias 125 by removing one or more portions of the build-layer to create cavities in the layer(s) 123 above the raised pad structures 119. The cavities in the layer(s) 123 reveal top surfaces of the raised pad structures 119. The vias 125 may be formed after a suitable metal or metal alloy (e.g., Cu, etc.) is deposited using any suitable deposition technique (e.g., plating, sputter seed deposition, etc.) into the cavities. For a further example, a seed layer may be deposited in the cavities after top surfaces of raised pad structures 119 are revealed and prior to deposition of the metal or metal alloy in the cavities to form the vias 125.

For an example where the layer(s) 123 includes a PID layer, vias 125 may be formed by: (i) exposing one or more portions of the PID layer to light (e.g., ultra-violet (UV), etc.) via a photomask, as required by one or more lithography techniques; and (ii) removing any unexposed portion of the PID layer to create cavities in the PID layer by using wet or dry etching, lift-off, stripping (e.g., organic stripping, inorganic stripping, dry stripping, etc.), any other suitable technique, or any combination of suitable techniques. Removing the unexposed portions of the PID layer is performed until the cavities reveal top surfaces of the raised pad structures 119. The vias 125 are formed, in this example, after a suitable metal or metal alloy (e.g., copper, etc.) is deposited using any suitable deposition technique (e.g., plating, sputter seed deposition, etc.) into the cavities. For a further example, a seed layer may be deposited in the cavities after top surfaces of raised pad structures 119 are revealed and prior to deposition of the metal or metal alloy in the cavities to form the vias 125.

For an example where the layer(s) 123 includes a PID layer on a build-up layer formed from a dielectric material, vias 125 may be formed by: (i) exposing one or more portions of the PID layer to light (e.g., ultra-violet (UV), etc.) via a photomask, as required by one or more lithography techniques; (ii) removing any unexposed portion of the PID layer to create cavities in the PID layer by using wet or dry etching, lift-off, doping, stripping (e.g., organic stripping, inorganic stripping, dry stripping, etc.), any other suitable technique, or any combination of suitable techniques; and (iii) further processing the cavities to form the vias 125 by removing portions of the layer(s) 123 in the cavities until top surfaces of raised pad structures 119 are revealed. For this example, removing the unexposed portions of the PID layer is performed until the cavities reveal uncovered portions of the build-up layer formed from dielectric materials. Furthermore, laser drilling techniques, laser ablation techniques, and/or any other suitable techniques known in the art for removing dielectric materials may be used to remove the uncovered portions of the build-up layer until the cavities reveal top surfaces of the raised pad structures 119. The vias 125 are formed, in this example, after a suitable metal or metal alloy (e.g., copper, etc.) is deposited using any suitable deposition technique (e.g., plating, sputter seed deposition, etc.) into the cavities. For a further example, a seed layer may be deposited in the cavities after top surfaces of raised pad structures 119 are revealed and prior to deposition of the metal or metal alloy in the cavities to form the vias 125.

As shown by the immediately preceding examples, vias 125 may be formed using one or more suitable techniques. At least one of the vias 125 shown in FIG. 1M has a tapered shape; however, at least one of the vias 125 may have another shape (e.g., a non-tapered shape, etc.).

Moving on to FIG. 1N, one or more layer(s) 131 may be formed after vias 125 are formed. The layer(s) 131 may include any suitable layers (e.g., metallization layer, resist layer, seed layer, passivation layer, etc.). For one embodiment, the layer(s) 131 include conductive structures 133 formed over the vias 125 for coupling the raised pad structures 119 to the layer(s) 131. The conductive structures 133 may be formed using any suitable technique. For one example, formation of conductive structures 133 may include one or more of the following operations: (i) depositing a seed layer on top surfaces of the layer(s) 123 and the raised pad structures 119; (i) depositing a resist layer on the seed layer; (ii) patterning the resist layer by exposing one or more portions of the resist layer using one or more lithography techniques; (iii) removing any unexposed portion(s) of the resist layer to create openings above the vias 125 in the remaining portion(s) of the resist layer; and (iv) plating one or more conductive materials (e.g., metal, metal alloy, etc.) into the openings above the vias 125. For an alternate example, the seed layer is deposited in the openings above the vias 125 prior to plating one or more metal layers into the openings above the vias 125. In the illustrated embodiment shown in FIG. 1N, the conductive structures 133 are shown as pillars. Other embodiments, however, are not so limited. The structures 133 may have any shape and/or size (e.g., z-height, etc.). For one example, the structures 133 may be pads.

After the operations shown in FIG. 1N are performed, a semiconductor package portion 100 comprising inductor features 111A-B and a magnetic film 121 is formed. The semiconductor package portion 100 may be subjected additional operations/processes (not shown in FIGS. 1A-1N) in order to fabricate a complete semiconductor package. These additional operations/processes include one or more current semiconductor fabrication processes that comply with current industry standards. Examples include, but are not limited to, desmearing processes, electroless plating processes, flash etching processes, soft etching processes, seed etching processes, and processes involving roughening baths. For one embodiment, a complete semiconductor package may comprise one or more portions 100.

For one embodiment, the semiconductor package portion 100 is not affected (or not as affected) by one or more of the drawbacks associated with some proposed ACIs having magnetic films. For a first example, any additional operation(s) in compliance with current industry standards may be performed on the semiconductor package portion 100 without requiring costly tailoring of the magnetic film 121. This is at least because the layer(s) 123, the vias 125, and the raised pad structures 119 isolate the inductor features 111A-B and the magnetic filler 121 from interacting with bath chemistries, materials, and/or tools used in the additional operation(s). For a second example, there is a minimized risk of contaminating bath chemistries, materials, and/or tools used in the additional operation(s) performed on the semiconductor package portion 100. This is also at least because the layer(s) 123, the vias 125, and the raised pad structures 119 isolate the inductor features 111A-B and the magnetic 121 from interacting with bath chemistries, materials, and/or tools used in the additional operation(s). For a third example, there is a minimized risk of having dirty vias in the semiconductor package portion 100. This is because the vias 125 are fabricated through the layer(s) 123 directly above the raised pad structures 119 (and not through the layer(s) 123 directly above the magnetic film 121 and/or the inductor features 111A-B). That is, any techniques used for forming the vias 125 (e.g., laser drilling, laser ablation, any other suitable technique known in the art, any combination thereof, etc.) is not applied to or used to contaminate the magnetic film 121 and/or the inductor features 111A-B.

Referring now to FIGS. 1O-1R, which illustrate one or more exemplary additional operations/processes that may be performed after the semiconductor portion 100 is formed. With specific regard to FIG. 1O, formation of the layer(s) 131 includes forming the conductive structures 133 and inductor features 135. The inductor features 135 may be formed using any suitable technique. For example, the technique used to form the conductive structures 133, as described above in connection with FIG. 1N, may be used to form the inductor features 135. For one or more embodiments, thicknesses of the inductor features 135 (e.g., z-heights, etc.) may or may not be equal to thicknesses of the conductive structures 133 (e.g., z-heights, etc.). For one embodiment, thicknesses of the inductor features 135 (e.g., z-heights, etc.) are equal or substantially equal to thicknesses of the conductive structures 133 (e.g., z-heights, etc.).

With regard now to FIG. 1P, formation of the layer(s) 131 may include encapsulating the conductive structures 133, the inductor features 135, and the uncovered top surfaces of the layer(s) 123 in a solder resist composition 137. For one embodiment, encapsulation of the conductive structures 133, the inductor features 135, and the uncovered top surfaces of the layer(s) 123 is performed by lamination of the solder resist composition 137.

Moving on to FIG. 1Q, the solder resist composition 137 may be opened using one or more suitable techniques that create solder resist openings 139 and opening 141. For one embodiment, the solder resist openings 139 are designed such that top surfaces of the conductive structures 133 are partially or completely uncovered. For one embodiment, the solder resist openings 139 includes a surface finish that may be used for coupling the solder bumps. Techniques for coupling solder bumps includes reflowing techniques as is known in the art. For one embodiment, the opening 141 is designed such that: (i) one or more portions of the solder resist composition 137 encapsulating the inductor features 135 are removed; and (ii) one or more portions of the solder resist composition 137 encapsulating one or more portions of the top surface of the layer(s) 123 are removed. For a further embodiment, the exposed or uncovered portion(s) of the top surface of the layer(s) 123 are adjacent to the exposed or uncovered inductor features 135. Techniques used to create solder resist openings 139 and the opening 141 include laser drilling, laser ablation, etching, chemical stripping, lithography, any other suitable technique, and any combination of suitable techniques known in the art.

Referring now to FIG. 1R, a magnetic paste 143 may be deposited into the opening 141 and used to encapsulate the inductor features 135. The magnetic paste 143, according to one or more embodiments can be a non-conductive epoxy or a polymer filled with magnetic particles. The magnetic paste 143 may, in one or more embodiments, be formed from any suitable magnetic paste powders known in the art (e.g., manganese zinc ferrite, any other suitable magnetic paste, any combination of suitable magnetic pastes, etc.). Magnetic pastes are described above. Furthermore, any suitable technique for depositing a magnetic paste known in the art may be used to deposit the magnetic paste 143 into the opening 141.

After the operations described in connection with FIG. 1R are performed, a semiconductor package portion 190 comprising a first set of inductor features 111A-B, a magnetic film 121, a second set of inductor features 135, and a magnetic paste 143 is formed. The semiconductor package portion 190 may be subjected additional operations/processes (not shown in FIGS. 1A-1R) in order to fabricate a complete semiconductor package. One or more of these additional operations/processes are described above in connection with at least FIG. 1N. For one embodiment, a complete semiconductor package may comprise one or more portions 190. Furthermore, the semiconductor package portion 190 has similar or the same advantages as the advantages described above in connection with the semiconductor package portion 100.

Various operations are described in connection with FIGS. 1A-1R (and with the figure(s) described below) as multiple discrete operations in turn, in a manner that is most helpful in understanding the claimed subject matter. However, the order of description should not be construed as to imply that these operations are necessarily order dependent. Embodiments of the present disclosure may be implemented into a system using any suitable hardware and/or software to configure as desired.

Figure 2:
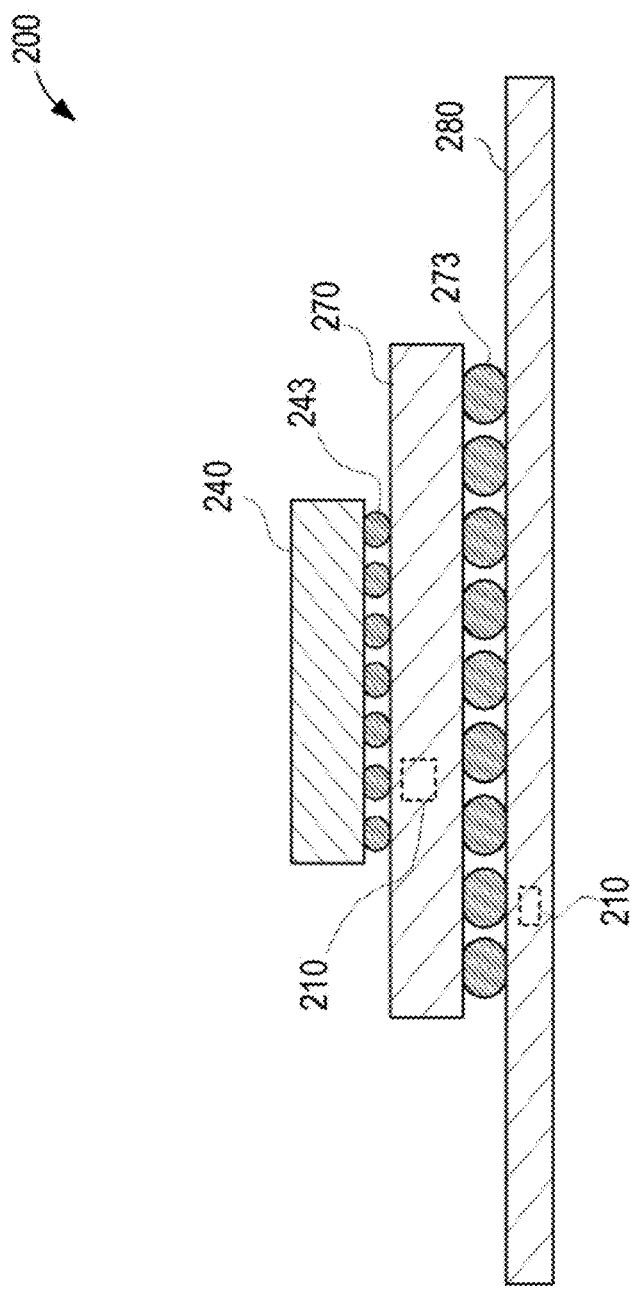
FIG. 2 illustrates a cross-sectional illustration of a packaged system, according to an embodiment.

Referring now to FIG. 2, a cross-sectional illustration of a packaged system 200 is shown, in accordance with an embodiment. For an embodiment, the packaged system 200 may include a semiconductor die 240 electrically coupled to a package substrate 270 with solder bumps 243. For additional embodiments, the semiconductor die 240 may be electrically coupled to the package substrate 270 with any suitable interconnect architecture, such as wire bonding or the like. The package substrate 270 may be electrically coupled to a board, such as a printed circuit board (PCB) 280, with solder bumps 273. For additional embodiments, the package substrate 270 may be electrically coupled to a board, such as the PCB 280, with any suitable interconnect architecture, such as wire bonding or the like.

For an embodiment, an inductor 210 formed based on one or more of the embodiments described above may be integrated into: (i) the package substrate 270; (ii) the board 280; or (iii) the package substrate 270 and the board 280. Embodiments include any number of inductors 210 formed into the package substrate 270 and/or the board 280. For example, a plurality of inductors 210 may be integrated—for power management, filtering, or any other desired use—into: (i) the package substrate 270; (ii) the board 280; or (iii) the package substrate 270 and the board 280.

Figure 3:
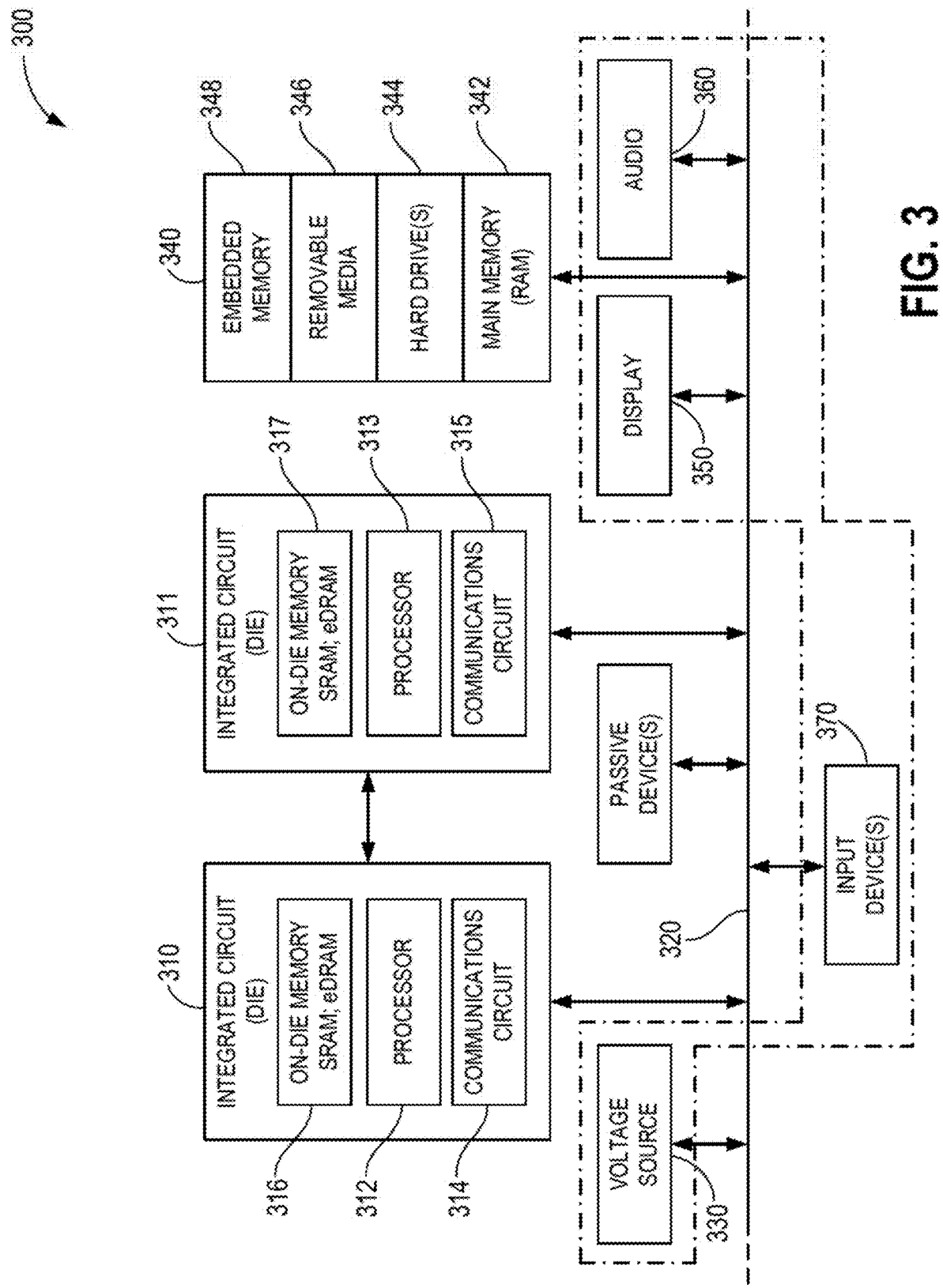
FIG. 3 is an illustration of a schematic block diagram of a computer system that utilizes a semiconductor package, according to an embodiment.

FIG. 3 illustrates a schematic of computer system 300 according to an embodiment. The computer system 300 (also referred to as an electronic system 300) can include a semiconductor package comprising inductor features and a magnetic film in accord with any of the embodiments and their equivalents as set forth in this disclosure. The computer system 300 may be a mobile device, a netbook computer, a wireless smart phone, a desktop computer, a hand-held reader, a server system, a supercomputer, or a high-performance computing system.

The system 300 can be a computer system that includes a system bus 320 to electrically couple the various components of the electronic system 300. The system bus 320 is a single bus or any combination of busses according to various embodiments. The electronic system 300 includes a voltage source 330 that provides power to the integrated circuit 310. For one embodiment, the voltage source 330 supplies current to the integrated circuit 310 through the system bus 320.

The integrated circuit 310 is electrically coupled to the system bus 320 and includes any circuit, or combination of circuits according to an embodiment. For an embodiment, the integrated circuit 310 includes a processor 312. As used herein, the processor 312 may mean any type of circuit such as, but not limited to, a microprocessor, a microcontroller, a graphics processor, a digital signal processor, or another processor. For an embodiment, the processor 312 includes, or is coupled with, a semiconductor package comprising inductor features and a magnetic film in accord with any of the embodiments and their equivalents, as described in the foregoing specification. For an embodiment, SRAM embodiments are found in memory caches of the processor. Other types of circuits that can be included in the integrated circuit 310 are a custom circuit or an application-specific integrated circuit (ASIC), such as a communications circuit 314 for use in wireless devices such as cellular telephones, smart phones, pagers, portable computers, two-way radios, and similar electronic systems, or a communications circuit for servers. For an embodiment, the integrated circuit 310 includes on-die memory 316 such as static random-access memory (SRAM). For an embodiment, the integrated circuit 310 includes embedded on-die memory 316 such as embedded dynamic random-access memory (eDRAM). For one embodiment, the on-die memory 316 may be packaged with a process in accord with any of the embodiments and their equivalents, as described in the foregoing specification.

For an embodiment, the integrated circuit 310 is complemented with a subsequent integrated circuit 311. Useful embodiments include a dual processor 313 and a dual communications circuit 315 and dual on-die memory 317 such as SRAM. For an embodiment, the dual integrated circuit 310 includes embedded on-die memory 317 such as eDRAM.

For an embodiment, the electronic system 300 also includes an external memory 340 that in turn may include one or more memory elements suitable to the particular application, such as a main memory 342 in the form of RAM, one or more hard drives 344, and/or one or more drives that handle removable media 346, such as diskettes, compact disks (CDs), digital variable disks (DVDs), flash memory drives, and other removable media known in the art. The external memory 340 may also be embedded memory 348 such as the first die in a die stack, according to an embodiment.

For an embodiment, the electronic system 300 also includes a display device 350 and an audio output 360. For an embodiment, the electronic system 300 includes an input device such as a controller 370 that may be a keyboard, mouse, trackball, game controller, microphone, voice-recognition device, or any other input device that inputs information into the electronic system 300. For an embodiment, an input device 370 is a camera. For an embodiment, an input device 370 is a digital sound recorder. For an embodiment, an input device 370 is a camera and a digital sound recorder.

At least one of the integrated circuits 310 or 311 can be implemented in a number of different embodiments, including a semiconductor package comprising inductor features and a magnetic film as described herein, an electronic system, a computer system, one or more methods of fabricating an integrated circuit, and one or more methods of fabricating an electronic assembly that includes a semiconductor package comprising inductor features and a magnetic film, according to any disclosed embodiments set forth herein and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the semiconductor package comprising inductor features and a magnetic film in accordance with any of the disclosed embodiments as set forth herein and their art-recognized equivalents. A foundation substrate may be included, as represented by the dashed line of FIG. 3. Passive devices may also be included, as is also depicted in FIG. 3.

Reference throughout this specification to "one embodiment," "an embodiment," "another embodiment" and their variations means that a particular feature, structure, configuration, or characteristic described in connection with the embodiment is included in at least one embodiment. Thus, the appearances of the phrase "for one embodiment," "for an embodiment," "for another embodiment," "in one embodiment," "in an embodiment," "in another embodiment," or their variations in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used in the foregoing specification refer to a relative position of one layer with respect to other layers. One layer "over" or "on" another layer or bonded "to" or in "contact" with another layer may be directly in contact with the other layer or may have one or more intervening layers. One layer "between" layers may be directly in contact with the layers or may have one or more intervening layers.

The description provided above in connection with one or more embodiments as described herein that is included as part of a process of forming semiconductor packages may also be used for other types of IC packages and mixed logic-memory package stacks. In addition, the processing sequences may be compatible with both wafer level packages (WLP), and integration with surface mount substrates such as LGA, QFN, and ceramic substrates.

In the foregoing specification, abstract, and/or figures, numerous specific details are set forth, such as specific materials and processing operations, in order to provide a thorough understanding of embodiments described herein. It will, however, be evident that any of the embodiments described herein may be practiced without these specific details. In other instances, well-known features, such as the integrated circuitry of semi conductive dies, are not described in detail in order to not unnecessarily obscure embodiments described herein. Furthermore, it is to be understood that the various embodiments shown in the Figures and described in connection with the Figures are illustrative representations and are not necessarily drawn to scale. Thus, various modifications and/or changes may be made without departing form the broader spirit and scope of the embodiments described in connection with the foregoing specification, abstract, and/or Figures.

Embodiments described herein include a method of forming a cored or coreless semiconductor package, the method comprising: forming a plurality of inductor features on a first build-up layer, the plurality of inductor features comprising a pad and a conductive line; forming a raised pad structure on the first build-up layer by fabricating a pillar structure on the pad, wherein a size of the pillar structure is approximately equal or equal to a corresponding size of the pad such that the pillar structure and the pad are aligned or minimally misaligned relative to each other; encapsulating, in response to the forming of the raised pad structure, the plurality of inductor features and the raised pad structure in a magnetic film, the magnetic film comprising one or more magnetic fillers; planarizing a top surface of the magnetic film until top surfaces of the raised pad structure and the magnetic film are co-planar; depositing an additional layer on the top surfaces of the raised pad structure and the magnetic film; and forming a via on the top surface of the raised pad structure by removing one or more portions of the additional layer above the raised pad structure.

Additional embodiments include a method, wherein the raised pad structure has a z-height that is larger than a z-height of each of the plurality of inductor features that is not the raised pad structure.

Additional embodiments include a method, wherein planarizing a top surface of the magnetic film comprises using a mechanical planarization technique to planarize the top surface of the magnetic film until top sides of the raised pad structure and the magnetic film are co-planar.

Additional embodiments include a method, wherein a size of the via is less than or equal to a corresponding size of the raised pad structure.

Additional embodiments include a method, further comprising forming a conductive structure over the via.

Additional embodiments include a method, further comprising forming a second plurality of inductor features on the additional layer.

Additional embodiments include a method, further comprising encapsulating one or more inductor features from the second plurality of inductor features in a magnetic paste.

Additional embodiments include one or more of the preceding embodiments set forth above, wherein the additional layer comprises one or more of: (i) a second build-up layer; and (ii) a photoimageable dielectric (PID) layer.

Additional embodiments include one or more of the preceding embodiments set forth above, wherein the magnetic film is a film comprised of: (i) one or more of an epoxy resin, a polyimide, and a glass-reinforced epoxy laminate material (e.g., FR4, G10, G11, FR4, FR5, FR6, etc.); and (ii) the one or more magnetic fillers.

Additional embodiments include one or more of the preceding embodiments set forth above, wherein the magnetic film comprises an organic dielectric epoxy laminate film having the one or more magnetic fillers therein.

Additional embodiments include one or more of the preceding embodiments set forth above, wherein at least one of the one or more magnetic fillers formed from one or more of: (i) a ferromagnetic material; and (ii) a ferrimagnetic material.

Additional embodiments include one or more of the preceding embodiments set forth above, wherein at least one of the one or more magnetic fillers is formed from one or more of: iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, and any ferrimagnetic material.

Additional embodiments include one or more of the preceding embodiments set forth above, wherein an inductor in the cored or coreless semiconductor package comprises one or more of: one or more features from the plurality of inductor features; the raised pad structure; the magnetic film;

the via; the conductive structure; one or more features from the second plurality of inductor features; and the magnetic paste.

Additional embodiments include a method, wherein an inductor in the cored or coreless semiconductor package comprises one or more of: one or more features from the plurality of inductor features; the raised pad structure; the magnetic film; the via; the conductive structure; one or more features from the second plurality of inductor features; and the magnetic paste.

Embodiments described herein include a semiconductor package, comprising: a plurality of inductor features on a first build-up layer, the plurality of inductor features comprising a pad and a conductive line; a raised pad structure on the first build-up layer, the raised pad structure comprising a pillar structure on the pad, wherein a size of the pillar structure is approximately equal or equal to a corresponding size of the pad such that the pillar structure and the pad are aligned or minimally misaligned relative to each other; a magnetic film encapsulating the plurality of inductor features and the raised pad structure in a magnetic film, the magnetic film comprising one or more magnetic fillers, wherein top surfaces of the raised pad structure and the magnetic film are co-planar; an additional layer on the top surfaces of the raised pad structure and the magnetic film; and a via on the top surface of the raised pad structure, the via being formed through the additional layer.

Additional embodiments include a semiconductor package, wherein the raised pad structure has a z-height that is larger than a z-height of each of the plurality of inductor features that is not the raised pad structure.

Additional embodiments include a semiconductor package, wherein a mechanical planarization technique is used to planarize the top surface of the magnetic film until top surfaces of the raised pad structure and the magnetic film are co-planar.

Additional embodiments include a semiconductor package, wherein a size of the via is less than or equal to a corresponding size of the raised pad structure.

Additional embodiments include a semiconductor package, further comprising a conductive structure over the via.

Additional embodiments include a semiconductor package, further comprising a second plurality of inductor features on the additional layer.

Additional embodiments include a semiconductor package, further comprising a magnetic paste encapsulating one or more inductor features selected from the second plurality of inductor features.

Additional embodiments include one or more of the preceding embodiments set forth above, wherein the additional layer comprises one or more of: (i) a second build-up layer; and (ii) a photoimageable dielectric (PID) layer.

Additional embodiments include one or more of the preceding embodiments set forth above, wherein the magnetic film is a film comprised of: (i) one or more of an epoxy resin, a polyimide, and a glass-reinforced epoxy laminate material (e.g., FR4, G10, G11, FR4, FR5, FR6, etc.); and (ii) the one or more magnetic fillers.

Additional embodiments include one or more of the preceding embodiments set forth above, wherein the magnetic film comprises an organic dielectric epoxy laminate film having the one or more magnetic fillers therein.

Additional embodiments include one or more of the preceding embodiments set forth above, wherein at least one of the one or more magnetic fillers formed from one or more of: (i) a ferromagnetic material; and (ii) a ferrimagnetic material.

Additional embodiments include one or more of the preceding embodiments set forth above, wherein at least one of the one or more magnetic fillers is formed from one or more of: iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, and any ferrimagnetic material.

Additional embodiments include one or more of the preceding embodiments set forth above, wherein an inductor in the cored or coreless semiconductor package comprises one or more of: one or more features from the plurality of inductor features; the raised pad structure; the magnetic film; the via; the conductive structure; one or more features from the second plurality of inductor features; and the magnetic paste.

Additional embodiments include a semiconductor package, wherein an inductor in the cored or coreless semiconductor package comprises one or more of: one or more features from the plurality of inductor features; the raised pad structure; the magnetic film; the via; the conductive structure; one or more features from the second plurality of inductor features; and the magnetic paste.

Embodiments described herein include a method of forming a cored or coreless semiconductor package, the method comprising: forming a plurality of inductor features on a first build-up layer, the plurality of inductor features comprising a pad and a conductive line; forming a raised pad structure on the first build-up layer by fabricating a pillar structure on the pad, wherein a size of the pillar structure is approximately equal or equal to a corresponding size of the pad such that the pillar structure and the pad are aligned or minimally misaligned relative to each other; encapsulating, in response to the forming of the raised pad structure, the plurality of inductor features and the raised pad structure in a magnetic film, the magnetic film comprising one or more magnetic fillers; planarizing a top surface of the magnetic film until top surfaces of the raised pad structure and the magnetic film are co-planar; depositing an additional layer on the top surfaces of the raised pad structure and the magnetic film; forming a via on the top surface of the raised pad structure by removing one or more portions of the additional layer above the raised pad structure; forming a conductive structure over the via; forming a second plurality of inductor features on the additional layer; and encapsulating one or more inductor features from the second plurality of inductor features in a magnetic paste.

Additional embodiments include a method, wherein the raised pad structure has a z-height that is larger than a z-height of each of the plurality of inductor features that is not the raised pad structure.

Additional embodiments include a method, wherein planarizing a top surface of the magnetic film comprises using a mechanical planarization technique to planarize the top surface of the magnetic film until top sides of the raised pad structure and the magnetic film are co-planar.

Additional embodiments include a method, wherein a size of the via is less than or equal to a corresponding size of the raised pad structure.

Additional embodiments include one or more of the preceding embodiments set forth above, wherein the additional layer comprises one or more of: (i) a second build-up layer; and (ii) a photoimageable dielectric (PID) layer.

Additional embodiments include one or more of the preceding embodiments set forth above, wherein the magnetic film is a film comprised of: (i) one or more of an epoxy resin, a polyimide, and a glass-reinforced epoxy laminate material (e.g., FR4, G10, G11, FR4, FR5, FR6, etc.); and (ii) the one or more magnetic fillers.

Additional embodiments include one or more of the preceding embodiments set forth above, wherein the magnetic film comprises an organic dielectric epoxy laminate film having the one or more magnetic fillers therein.

Additional embodiments include one or more of the preceding embodiments set forth above, wherein at least one of the one or more magnetic fillers formed from one or more of: (i) a ferromagnetic material; and (ii) a ferrimagnetic material.

Additional embodiments include one or more of the preceding embodiments set forth above, wherein at least one of the one or more magnetic fillers is formed from one or more of: iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, and any ferrimagnetic material.

Additional embodiments include one or more of the preceding embodiments set forth above, wherein an inductor in the cored or coreless semiconductor package comprises one or more of: the pad; the conductive line; the raised pad structure; the magnetic film; the primer layer; the via; the conductive structure; the second pad; the second trace; and the magnetic paste.

Additional embodiments include one or more of the preceding embodiments set forth above, wherein an inductor in the cored or coreless semiconductor package comprises one or more of: one or more features from the plurality of inductor features; the raised pad structure; the magnetic film; the via; the conductive structure; one or more features from the second plurality of inductor features; and the magnetic paste.

Additional embodiments include a method, wherein an inductor in the cored or coreless semiconductor package comprises one or more of: one or more features from the plurality of inductor features; the raised pad structure; the magnetic film; the via; the conductive structure; one or more features from the second plurality of inductor features; and the magnetic paste.

Embodiments described herein include a semiconductor package, comprising: a plurality of inductor features on a first build-up layer, the plurality of inductor features comprising a pad and a conductive line; a raised pad structure on the first build-up layer, the raised pad structure comprising a pillar structure on the pad, wherein a size of the pillar structure is approximately equal or equal to a corresponding size of the pad such that the pillar structure and the pad are aligned or minimally misaligned relative to each other; a magnetic film encapsulating the plurality of inductor features and the raised pad structure in a magnetic film, the magnetic film comprising one or more magnetic fillers, wherein top surfaces of the raised pad structure and the magnetic film are co-planar; an additional layer on the top surfaces of the raised pad structure and the magnetic film; a via on the top surface of the raised pad structure, the via being formed through the additional layer; a conductive structure over the via; a second plurality of inductor features on the additional layer; and a magnetic paste encapsulating one or more inductor features selected from the second plurality of inductor features.

Embodiments described herein include a semiconductor package, comprising: a plurality of inductor features on a first build-up layer, the plurality of inductor features comprising a pad and a conductive line; a raised pad structure on the first build-up layer, the raised pad structure comprising a pillar structure on the pad, wherein a size of the pillar structure is less than a corresponding size of the pad such that the pillar structure and the pad are misaligned relative to each other; a magnetic film encapsulating the plurality of inductor features and the raised pad structure in a magnetic film, the magnetic film comprising one or more magnetic fillers, wherein top surfaces of the raised pad structure and the magnetic film are co-planar; an additional layer on the top surfaces of the raised pad structure and the magnetic film; and a via on the top surface of the raised pad structure, the via being formed through the additional layer.

Additional embodiments include a semiconductor package, wherein the raised pad structure has a z-height that is larger than a z-height of each of the plurality of inductor features that is not the raised pad structure.

Additional embodiments include a semiconductor package, wherein a mechanical planarization technique is used to planarize the top surface of the magnetic film until top surfaces of the raised pad structure and the magnetic film are co-planar.

Additional embodiments include a semiconductor package, wherein a size of the via is less than or equal to a corresponding size of the raised pad structure.

Additional embodiments include a semiconductor package, wherein the magnetic film comprises an organic dielectric epoxy laminate film having the one or more magnetic fillers therein.

Additional embodiments include one or more of the preceding embodiments set forth above, wherein the additional layer comprises one or more of: (i) a second build-up layer; and (ii) a photoimageable dielectric (PID) layer.

Additional embodiments include one or more of the preceding embodiments set forth above, wherein the magnetic film is a film comprised of: (i) one or more of an epoxy resin, a polyimide, and a glass-reinforced epoxy laminate material (e.g., FR4, G10, G11, FR4, FR5, FR6, etc.); and (ii) the one or more magnetic fillers.

Additional embodiments include one or more of the preceding embodiments set forth above, wherein the magnetic film comprises an organic dielectric epoxy laminate film having the one or more magnetic fillers therein.

Additional embodiments include one or more of the preceding embodiments set forth above, wherein at least one of the one or more magnetic fillers formed from one or more of: (i) a ferromagnetic material; and (ii) a ferrimagnetic material.

Additional embodiments include one or more of the preceding embodiments set forth above, wherein at least one of the one or more magnetic fillers is formed from one or more of: iron (Fe), cobalt (Co), nickel (Ni), any ferrite that includes Fe and oxygen (O), ferrous oxide (FeO), a metal alloy comprising one or more of Fe, Co, and Ni (e.g., CoFe, NiFe, etc.), any ferromagnetic material, and any ferrimagnetic material.

Additional embodiments include one or more of the preceding embodiments set forth above, wherein an inductor in a semiconductor package comprises one or more of: one or more features from the plurality of inductor features; the raised pad structure; the magnetic film; the via; the conductive structure; one or more features from the second plurality of inductor features; and the magnetic paste.

Additional embodiments include a semiconductor package, wherein an inductor in the semiconductor package comprises one or more of: one or more features from the plurality of inductor features; the raised pad structure; the magnetic film; the via; the conductive structure; one or more features from the second plurality of inductor features; and the magnetic paste.

In the description, drawings, and claims provided herein, the use of "at least one of A, B, and C", "at least one of A, B, or C", "one or more of A, B, or C", or "one or more of A, B, and C" is intended encompass: (i) A alone; (ii) B alone; (iii) C alone; (iv) A and B together; (v) A and C together; (vi) B and C together; or (vii) A, B, and C together. Furthermore, the use of "A, B, and/or C" is intended encompass: (i) A alone; (ii) B alone; (iii) C alone; (iv) A and B together; (v) A and C together; (vi) B and C together; or (vii) A, B, and C together. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrases "A or B", "A and B", and "A and/or B" will be understood to include the possibilities of "A alone" or "B alone" or "A and B."

The terms used in the following claims should not be construed to limit any of the embodiments described in connection with the foregoing specification, abstract, and/or Figures to the specific embodiments set forth in the foregoing specification, abstract, Figures, and/or claims. Rather, the scope of the claims are to be construed in accordance with established doctrines of claim interpretation.

What is claimed is:

1. A semiconductor package, comprising:
   a plurality of inductor features on a first build-up layer, the plurality of inductor features comprising a pad and a conductive line;
   a raised pad structure on the first build-up layer, the raised pad structure comprising a pillar structure on the pad, wherein a size of the pillar structure is approximately equal or equal to a corresponding size of the pad such that the pillar structure and the pad are aligned or minimally misaligned relative to each other;
   a magnetic film encapsulating the plurality of inductor features and the raised pad structure, the magnetic film comprising one or more magnetic fillers, wherein top surfaces of the raised pad structure and the magnetic film are co-planar;
   an additional layer on the top surfaces of the raised pad structure and the magnetic film, the additional layer in direct contact with the magnetic film; and
   a via on the top surface of the raised pad structure, the via being through the additional layer.

2. The semiconductor package of claim 1, wherein the raised pad structure has a z-height that is larger than a z-height of each of the plurality of inductor features that is not the raised pad structure.

3. The semiconductor package of claim 1, wherein a mechanical planarization technique is used to planarize the top surface of the magnetic film until top surfaces of the raised pad structure and the magnetic film are co-planar.

4. The semiconductor package of claim 1, wherein a size of the via is less than or equal to a corresponding size of the raised pad structure.

5. The semiconductor package of claim 1, further comprising a conductive structure over the via.

6. The semiconductor package of claim 5, further comprising a second plurality of inductor features on the additional layer.

7. The semiconductor package of claim 6, further comprising a magnetic paste encapsulating one or more inductor features selected from the second plurality of inductor features.

8. The semiconductor package of claim 1, wherein the additional layer comprises one or more of: (i) a second build-up layer; and (ii) a photoimageable dielectric (PID) layer.

9. The semiconductor package of claim 1, wherein the magnetic film is a film comprised of: (i) one or more of an epoxy resin, a polyimide, and a glass-reinforced epoxy laminate material; and (ii) the one or more magnetic fillers.

10. The semiconductor package of claim 9, wherein the magnetic film comprises an organic dielectric epoxy laminate film having the one or more magnetic fillers therein.

11. The semiconductor package of claim 10, wherein at least one of the one or more magnetic fillers formed from one or more of: (i) a ferromagnetic material; and
    (ii) a ferrimagnetic material.

12. The semiconductor package of claim 11, wherein at least one of the one or more magnetic fillers is formed from one or more of: iron (Fe), cobalt (Co), nickel (Ni), any ferrite that includes Fe and oxygen (O), ferrous oxide (FeO), and a metal alloy comprising one or more of Fe, Co, and Ni.

13. A method of forming a cored or coreless semiconductor package, comprising:
    forming a plurality of inductor features on a first build-up layer, the plurality of inductor features comprising a pad and a conductive line;
    forming a raised pad structure on the first build-up layer by fabricating a pillar structure on the pad, wherein a size of the pillar structure is approximately equal or equal to a corresponding size of the pad such that the pillar structure and the pad are aligned or minimally misaligned relative to each other;
    encapsulating the plurality of inductor features and the raised pad structure in a magnetic film, the magnetic film comprising one or more magnetic fillers;
    planarizing a top surface of the magnetic film until top surfaces of the raised pad structure and the magnetic film are co-planar;
    depositing an additional layer on the top surfaces of the raised pad structure and the magnetic film, the additional layer in direct contact with the magnetic film; and
    forming a via on the top surface of the raised pad structure by removing one or more portions of the additional layer above the raised pad structure.

14. The method of claim 13, wherein the raised pad structure has a z-height that is larger than a z-height of each of the plurality of inductor features that is not the raised pad structure.

15. The method of claim 13, wherein planarizing a top surface of the magnetic film comprises using a mechanical planarization technique to planarize the top surface of the magnetic film until top surfaces of the raised pad structure and the magnetic film are co-planar.

16. The method of claim 13, wherein a size of the via is less than or equal to a corresponding size of the raised pad structure to mitigate or eliminate any misalignment between the pillar structure and the pad.

17. The method of claim 13, further comprising forming a conductive structure over the via.

18. The method of claim 17, further comprising forming a second plurality of inductor features on the additional layer.

19. The method of claim 18, further comprising encapsulating one or more inductor features from the second plurality of inductor features in a magnetic paste.

20. A semiconductor package, comprising:
a plurality of inductor features on a first build-up layer, the plurality of inductor features comprising a pad and a conductive line;
a raised pad structure on the first build-up layer, the raised pad structure comprising a pillar structure on the pad, wherein a size of the pillar structure is less than a corresponding size of the pad;
a magnetic film encapsulating the plurality of inductor features and the raised pad structure, the magnetic film comprising one or more magnetic fillers, wherein top surfaces of the raised pad structure and the magnetic film are co-planar;
an additional layer on the top surfaces of the raised pad structure and the magnetic film, the additional layer in direct contact with the magnetic film; and
a via on the top surface of the raised pad structure, the via being through the additional layer.

21. The semiconductor package of claim 20, wherein the raised pad structure has a z-height that is larger than a z-height of each of the plurality of inductor features that is not the raised pad structure.

22. The semiconductor package of claim 20, wherein the magnetic film is a film comprised of: (i) one or more of an epoxy resin, a polyimide, and a glass-reinforced epoxy laminate material; and (ii) the one or more magnetic fillers.

23. The semiconductor package of claim 20, wherein at least one of the one or more magnetic fillers formed from one or more of: (i) a ferromagnetic material; and
(ii) a ferrimagnetic material.

24. The semiconductor package of claim 20, wherein the additional layer comprises one or more of: (i) a second build-up layer; and (ii) a photoimageable dielectric (PID) layer.

25. The semiconductor package of claim 20, further comprising:
a second plurality of inductor features on the additional layer; and
a magnetic paste encapsulating one or more inductor features selected from the second plurality of inductor features.

26. A semiconductor package, comprising:
a plurality of inductor features on a first build-up layer, the plurality of inductor features comprising a pad and a conductive line;
a raised pad structure on the first build-up layer, the raised pad structure comprising a pillar structure on the pad, wherein a size of the pillar structure is approximately equal or equal to a corresponding size of the pad such that the pillar structure and the pad are aligned or minimally misaligned relative to each other;
a magnetic film encapsulating the plurality of inductor features and the raised pad structure, the magnetic film comprising one or more magnetic fillers, wherein top surfaces of the raised pad structure and the magnetic film are co-planar;
an additional layer on the top surfaces of the raised pad structure and the magnetic film;
a via on the top surface of the raised pad structure, the via being through the additional layer;
a conductive structure over the via;
a second plurality of inductor features on the additional layer; and
a magnetic paste encapsulating one or more inductor features selected from the second plurality of inductor features.

* * * * *